US006848086B2

(12) United States Patent
Teig et al.

(10) Patent No.: US 6,848,086 B2
(45) Date of Patent: *Jan. 25, 2005

(54) METHOD AND APPARATUS FOR PERFORMING TECHNOLOGY MAPPING

(75) Inventors: Steven Teig, Menlo Park, CA (US); Asmus Hetzel, Berlin (DE)

(73) Assignee: Cadence Design Systems, Inc., San Jose, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/066,456

(22) Filed: Jan. 31, 2002

(65) Prior Publication Data

US 2003/0217340 A1 Nov. 20, 2003

(51) Int. Cl.[7] .............................................. G06F 17/50
(52) U.S. Cl. ................... 716/3; 716/2; 716/11
(58) Field of Search .......................... 716/1–18; 714/2, 714/14–16

(56) References Cited

U.S. PATENT DOCUMENTS

| | | | |
|---|---|---|---|
| 4,703,435 A | | 10/1987 | Darringer et al. |
| 5,003,487 A | | 3/1991 | Drumm et al. |
| 5,311,442 A | | 5/1994 | Fukushima |
| 5,519,630 A | | 5/1996 | Nishiyama et al. |
| 5,521,835 A | | 5/1996 | Trimberger |
| 5,526,276 A | * | 6/1996 | Cox et al. ................... 716/17 |
| 5,537,330 A | | 7/1996 | Damiano et al. |
| 5,537,341 A | | 7/1996 | Rose et al. |
| 5,574,441 A | | 11/1996 | Roes et al. |
| 5,610,829 A | | 3/1997 | Trimberger |
| 5,649,165 A | | 7/1997 | Jain et al. |
| 5,668,732 A | | 9/1997 | Khouja et al. |
| 5,696,694 A | * | 12/1997 | Khouja et al. .................. 716/5 |
| 5,696,974 A | | 12/1997 | Agrawal et al. |

(List continued on next page.)

OTHER PUBLICATIONS

Krishnamoorthy et al., Boolean Matching of Sequential Elements, Proceedings of the 31st annual conference on Design automation conference, pp. 691–697, Jun. 6–10, 1994, San Diego, California, United States.

NN78055443, "Automatic Remap", IBM Technical Disclosure Bulletin, vol. 20, No. 12, May 1978, pp. 5443–5445 (5 pages).

NN9411291, "Design of Portable Library using Parameterized Cells", IBM Technical Disclosure Bulletin, Vo., 37, No. 11, pp. 291–292 (4 pages).

(List continued on next page.)

*Primary Examiner*—Vuthe Siek
*Assistant Examiner*—Binh Tat
(74) *Attorney, Agent, or Firm*—Stattler Johansen & Adeli LLP

(57) ABSTRACT

Some embodiments of the invention provide a method for pre-tabulating sub-networks. This method (1) generates a sub-network that performs a function, (2) generates a parameter based on this function, and (3) stores the sub-network in a storage structure based on the generated parameter. In some embodiments, the generated sub-network has several circuit elements. Also, in some embodiments, the generated sub-network performs a set of two or more functions. Some embodiments store each generated sub-network in an encoded manner. Some embodiments provide a method for producing a circuit description of a design. This method (1) selects a candidate sub-network from the design, (2) identifies an output function performed by the sub-network, (3) based on the identified output function, identifies a replacement sub-network from a storage structure that stores replacement sub-networks, and (4) replaces the selected candidate sub-network with the identified replacement sub-network in certain conditions. In some embodiments, this method is performed to map a design to a particular technology library. Some embodiments provide a data storage structure that stores a plurality of sub-networks based on parameters derived from the output functions of the sub-networks.

13 Claims, 22 Drawing Sheets

U.S. PATENT DOCUMENTS

| | | | |
|---|---|---|---|
| 5,752,000 A | | 5/1998 | McGeer et al. |
| 5,787,010 A | | 7/1998 | Schaefer et al. |
| 5,892,678 A | | 4/1999 | Tokunoh et al. |
| 5,903,466 A | | 5/1999 | Beausang et al. |
| 5,991,524 A | | 11/1999 | Belkhale et al. |
| 6,023,566 A | * | 2/2000 | Belkhale et al. ............... 716/2 |
| 6,035,107 A | | 3/2000 | Kuehlmann et al. |
| 6,080,204 A | | 6/2000 | Mendel |
| 6,086,626 A | | 7/2000 | Jain et al. |
| 6,102,964 A | | 8/2000 | Tse et al. |
| 6,134,705 A | * | 10/2000 | Pedersen et al. ............... 716/18 |
| 6,216,252 B1 | | 4/2001 | Dangelo et al. |
| 6,298,472 B1 | * | 10/2001 | Phillips et al. ................ 716/18 |
| 6,301,687 B1 | | 10/2001 | Jain et al. |
| 6,301,696 B1 | | 10/2001 | Lien et al. |
| 6,311,317 B1 | | 10/2001 | Khoche et al. |
| 6,334,205 B1 | | 12/2001 | Iyer et al. |
| 6,336,208 B1 | | 1/2002 | Mohan et al. |
| 6,389,586 B1 | | 5/2002 | McElvain |
| 6,397,170 B1 | | 5/2002 | Dean et al. |
| 6,421,818 B1 | | 7/2002 | Dupenloup et al. |
| 6,446,240 B1 | | 9/2002 | Iyer et al. |
| 6,453,447 B1 | | 9/2002 | Gardner et al. |
| 6,470,478 B1 | | 10/2002 | Bargh et al. |
| 6,470,486 B1 | | 10/2002 | Knapp |
| 6,473,884 B1 | | 10/2002 | Ganai et al. |
| 6,490,717 B1 | * | 12/2002 | Pedersen et al. ............... 716/18 |
| 6,496,972 B1 | | 12/2002 | Segal |
| 6,519,609 B1 | | 2/2003 | Touzet |
| 6,519,754 B1 | | 2/2003 | McElvain et al. |
| 6,523,156 B2 | | 2/2003 | Cirit |
| 6,539,536 B1 | | 3/2003 | Singh et al. |
| 6,543,037 B1 | | 4/2003 | Limqueco et al. |
| 6,546,539 B1 | * | 4/2003 | Lu et al. ........................ 716/12 |
| 6,546,541 B1 | | 4/2003 | Petranovic et al. |
| 6,574,779 B2 | | 6/2003 | Allen et al. |
| 6,618,835 B1 | | 9/2003 | Garlapati et al. |
| 2001/0013113 A1 | * | 8/2001 | Matsunaga ..................... 716/3 |
| 2002/0157063 A1 | | 10/2002 | Besson |
| 2002/0178432 A1 | | 11/2002 | Kim et al. |
| 2003/0145288 A1 | | 7/2003 | Wang et al. |

OTHER PUBLICATIONS

Markovic et al., "FPGA to ASIC Conversion Design Methodology with the Support for Fast Retargetting to Different CMOS Implementation Technologies", Proceedings of 2002 $22^{nd}$ International Conference on Microelectronics, vol. 2, May 14, 2000, pp. 703–706.

Ruiz et al., "Design and Prototyping of DSP Custom Circuits Based on a Library of Arithmetic Components", vol. 1, Nov. 9, 1997, pp. 191–196.

Tamiya, T., "Delay Estimation for Technology Independent Synthesis", 1997 Proceedings of the ASP–DAC '97, Asia and South Pacific Design Automation Conference, Jan. 28, 1997, pp. 31–36.

Crastes, M. et al., A technology Mapping Method Based on Perfect and Semi–Perfect Matchings, Design Automation Conference, 1991, $28^{th}$ ACM/IEEE, Jun. 17–21, 1991, pp. 93–98.

Devadas, S. et al., Synthesis and Optimization for Robustly Delay–fault Testable Combinational Logic Circuits, Design Automation Conference, 1990, $27^{th}$ ACM/IEEE, Jun. 24–28, 1990, pp. 221–227.

Yi, J. H. et al., Technology Mapping for Storage Elements Based on BDD matching, Proceedings of the $40^{th}$ Midwest Symposium on Circuits and Systems, pp. 1099–1102, vol. 2, Aug. 1997.

U.S. Appl. No. 10/062,017, filed Jan. 31, 2002, Teig & Hetzel.

U.S. Appl. No. 10/061,459, filed Jan. 31, 2002, Teig & Hetzel.

U.S. Appl. No. 10/062,014, filed Jan. 31, 2002, Teig & Hetzel.

U.S. Appl. No. 10/062,044, filed Jan. 31, 2002, Teig & Hetzel.

U.S. Appl. No. 10/066,264, filed Jan. 31, 2002, Teig & Hetzel.

U.S. Appl. No. 10/066,188, filed Jan. 31, 2002, Teig & Hetzel.

U.S. Appl. No. 10/062,992, filed Jan. 31, 2002, Teig & Hetzel.

U.S. Appl. No. 10/061,474, filed Jan. 31, 2002, Teig & Hetzel.

U.S. Appl. No. 10/061,719 filed Jan. 31, 2002, Teig & Hetzel.

U.S. Appl. No. 10/062,993, filed Jan. 31, 2002, Teig & Hetzel.

U.S. Appl. No. 10/062,047, filed Jan. 31, 2002, Teig & Hetzel.

D. Jongeneel, R. Otten, Y. Watanabe and R. K. Brayton, Area and Search Space Control for Technology Mapping, $37^{th}$ Design Automation Conference, 86–91, 2000.

Henrik Reif Andersen, An Introduction to Binary Decision Diagrams, Oct. 1997 (minor revisions Apr. 1998), 36 pp.

Jerry Burch and David Long, Efficient Boolean Function Matching, Proc., ICCAD 1992, 408–411.

John Fishburn, A Depth–Decreasing Heuristic for Combinational Logic; or How to Convert Ripple–Carry Adder into a Carry–Lookahead Adder or Anything In–Between, Proceedings of the $27^{th}$ Design Automation Conference, 361–364, 1990.

Kamal Chaudhary and Massoud Pedram, A Near Optimal Algorithm for Technology Mapping Minimizing Area under Delay Constraints, Proceedings of the $29^{th}$ Design Automation Conference, 492–498, 1992.

Kurt Keutzer, DAGON: Technology Binding and Local Optimization by DAG Matching, Proceedings of the $24^{th}$ Design Automation Conference, 341–347, 1987.

Randal Bryant, Symbolic Boolean Manipulation with Ordered Binary Decision Diagrams, CMU CS Tech Report CMU–CS–92–160.

Uwe Hinsberger and Reiner Kolla, Boolean Matching for Large Libraries, Proceedings of the $35^{th}$ Design Automation Conference, 206–211, Jun. 1998.

Yuji Kukimoto, Robert K. Brayton, and Prashant Sawkar. Delay–Optimal Technology Mapping by DAG Covering, Dept. of Electrical Engineering and Computer Science, University of California, Berkeley, Strategic CAD Laboratories, Intel Corp., Oct. 1997.

Zbigniew J. Czech, et al., An Optimal Algorithm for Generating Minimal Perfect Hashing Functions, Information Processing Letters, 43(5); 257–264, Oct. 1992.

* cited by examiner

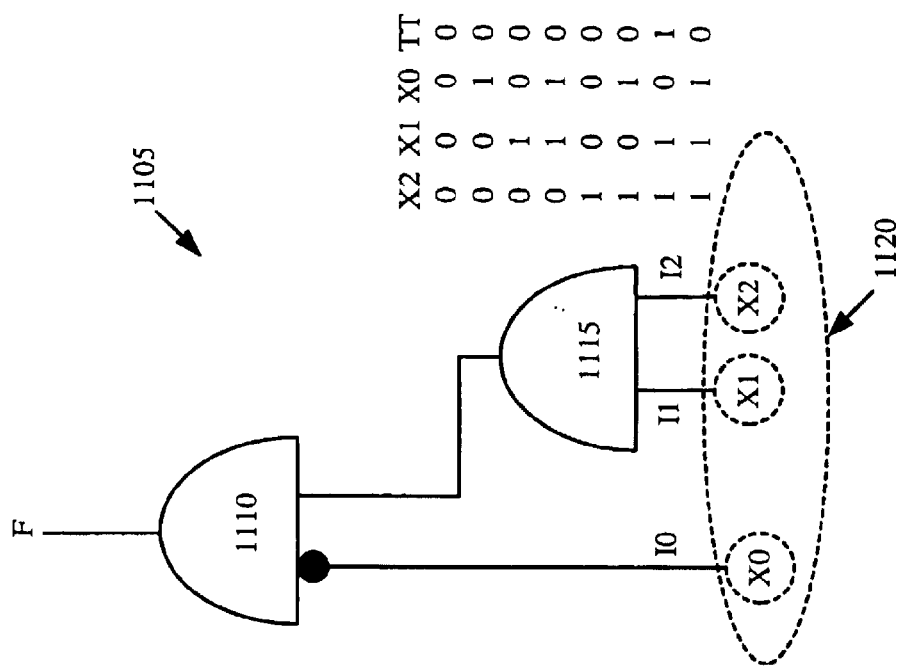
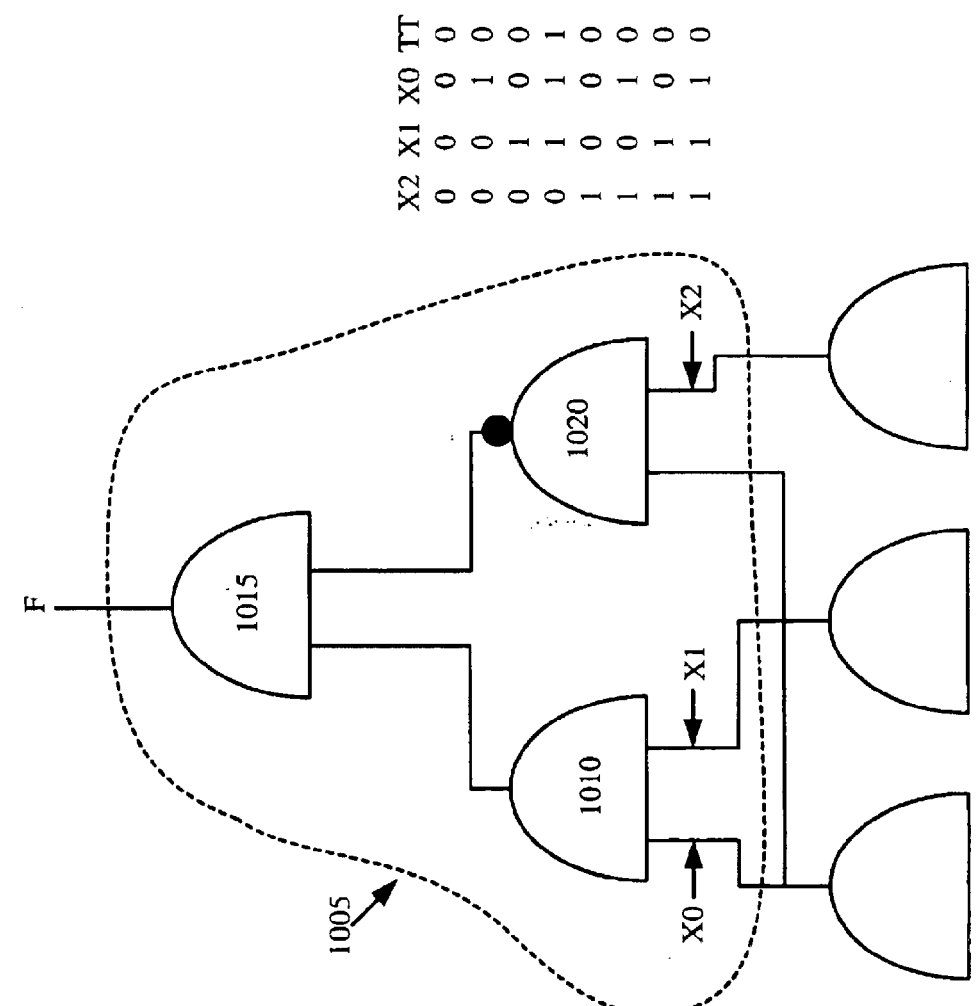
*Figure 11*
*Figure 10*

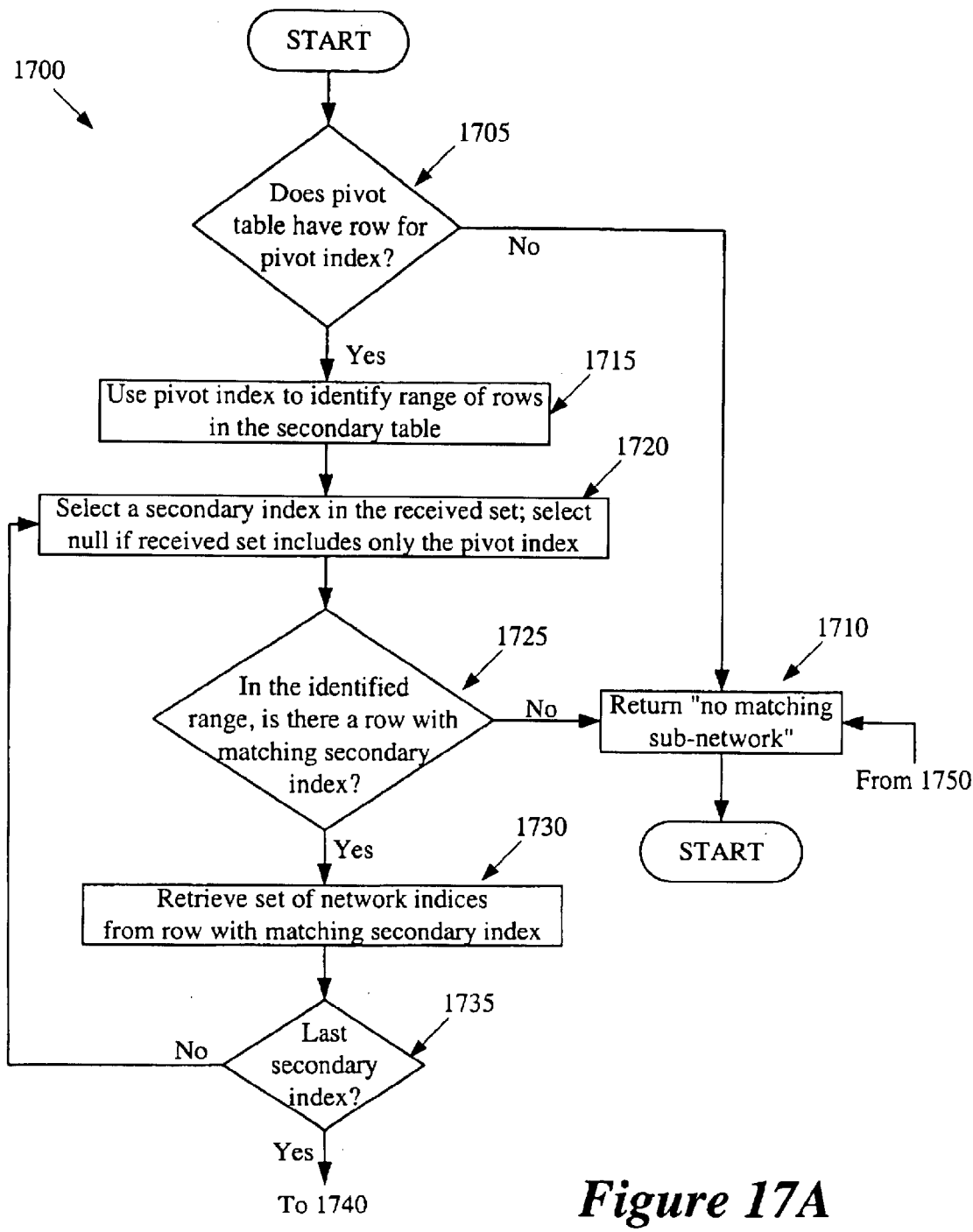
Figure 17: Figure 17A / Figure 17B

METHOD AND APPARATUS FOR PERFORMING TECHNOLOGY MAPPING

FIELD OF THE INVENTION

The present invention is directed towards method and apparatus for performing technology mapping.

BACKGROUND OF THE INVENTION

A combinational logic synthesizer produces an efficient circuit description for a specific region of an integrated circuit ("IC"). The IC region can be the entire IC or a portion (i.e., a block) of the IC. An IC or IC block typically performs a set of Boolean combinational-logic functions F that depend on a set of Boolean variables X. The Boolean function set F typically includes several functions $f\_1, \ldots, f\_m$, and the Boolean variable set X typically includes several variables $X\_1, \ldots, X\_n$.

In terms of the IC design, the variable set X includes inputs of the IC region. Also, the outputs of some or all Boolean functions $f\_i$ serve as the outputs of the IC region. In addition, each function $f\_i$ specifies a logic operation that needs to be performed on one or more inputs to the function. The output of each Boolean function $f\_i(X)$ can be either true or false.

Each function $f\_i$ may be initially given in a variety of formats, such as register transfer level (RTL) description (e.g., Verilog or VHDL description), a Boolean expression, or a technology-level netlist, etc. These description formats are mutually interchangeable, and there are well-known ways to transform one such description into another.

The "efficiency" of the circuit description produced by a synthesizer is usually measured in terms of the estimated "size" and "depth," although other criteria are also possible. Size and depth are defined with the desired output format of the description. Two output formats that are typically used for the IC design are: (1) technology-level output, and (2) intermediate-level output.

A technology-level design is a circuit description that is tied to a specific technology library, which is typically referred to as a target library. The circuit elements in a technology-level design can be implemented in silicon as units with known physical characteristics (e.g., known timing behavior, power consumption, size, etc.), since such circuit elements and their relevant logic and physical behavior are described in the target library. Accordingly, for technology-level output, the terms "size" and "depth" usually refers to an actual physical characteristic of the overall circuit. For instance, "size" can be measured in terms of the number of circuit elements, the total area of the circuit elements, the total power consumption, etc., while "depth" can be measured in terms of the circuit's timing behavior, which typically relates to the number of stages of the circuit.

An intermediate-level design is a circuit description that is not tied to a specific technology library. Rather, the circuit description is in some intermediate format that might be mapped onto a specific target library in a subsequent step. An intermediate-level output can include circuit elements that are not tied to a specific target library and that compute arbitrary, complex logic functions.

As intermediate design elements are not necessarily tied to a direct physical IC implementation, the "size" of an intermediate-level design is usually measured by an estimate of the final area, the total sum of all variables within the functions performed by the circuit elements in the design, or some other abstract quantification. Similarly, the "depth" of an intermediate-level design is often abstractly quantified. For instance, it might be measured as the number of stages of the circuit plus an estimate about the internal depth of each circuit element. Other more sophisticated estimates are also possible.

The problem of deriving an efficient circuit design has been extensively studied, because both the size and speed of an IC directly depend on the efficiency of the circuit design. Three current approaches to the problem of combinational-logic optimization include: (1) rule-based techniques, (2) optimization-by-factoring techniques, and (3) two-level minimization techniques.

In rule-based systems, the input is typically a technology-level description. The system then iteratively tries to make improvements according to a relatively small fixed set of rules. Each rule specifies some local configuration and the manner for replacing the configuration with a different set of circuit elements. Such rules are often defined and handcoded by experts and programmers, although they can sometimes be parameterized by end users of the system. Sets of rules are combined as scenarios or scripts (either by the end user or as templates by human experts). A script specifies a number of optimization passes that are applied sequentially and the subset of rules (and their parameters) that should be used during each pass.

In optimization-by-factoring systems, the input and output are typically expressed in terms of intermediate-level descriptions of circuit elements that implement arbitrary Boolean functions. These systems perform optimization by applying algebraic factoring algorithms that try to identify common sub-functions (i.e., common factors) in different parts of the circuit. Instead of realizing such a sub-function multiple times, the function is extracted (realized separately once) and the result is fed back to the multiple places where it is needed. These systems also modify the design in other ways, such as collapsing nodes (i.e., merging multiple nodes into one), etc.

Two-level minimization is a special optimization technique for two-level logic, e.g., for logic functions that are represented as a sum of products. The known algorithms are very powerful and, in part, even optimal. The application of two-level minimization is limited, though, because only simple logic functions can be represented efficiently in that form.

There are also a variety of algorithms and techniques that have been developed for special underlying chip technologies, such as PLA-folding, Look-Up Table optimization for FPGAs, etc. These are highly specific algorithms that are not suitable for the optimization of more general circuits.

Therefore, there is a need for a robust logic synthesizer that does not work only for simple logic functions or hand-coded functions. Ideally, such a synthesizer would use a rich set of pre-tabulated sub-networks. For such an approach, there is a need for an indexing scheme that efficiently stores and identifies pre-tabulated sub-networks. Ideally, such an indexing scheme would allow for the efficient storing and identification of multi-element and/or multi-function sub-networks.

Some current approaches use indexing schemes for mapping technology-level designs to a specific technology-level library for simple circuit elements. Current approaches find all circuit elements in the library that realize a single-function query. Previous filters were built such that each library circuit element was tested irrespective of whether it is a match. These tests were performed by checking several easy computable characteristics first (to exclude most possibilities fast) and then applying a final test for equality (based on some representation of the logic function).

SUMMARY OF THE INVENTION

Some embodiments of the invention provide a method for pre-tabulating sub-networks. This method (1) generates a sub-network that performs a function, (2) generates a parameter based on this function, and (3) stores the sub-network in a storage structure based on the generated parameter. In some embodiments, the generated sub-network has several circuit elements. Also, in some embodiments, the generated sub-network performs a set of two or more functions. The generated parameter is an index into the storage structure in some embodiments. Also, some embodiments generate this parameter based on a symbolic representation of an output of the function performed by the sub-network. The symbolic representation of a function's output is different than the function's name. Examples of symbolic representation include a binary decision diagram, a truthtable, or a Boolean expression. Some embodiments store the graph structure of each generated sub-network in an encoded manner.

Some embodiments of the invention provide a method for producing a circuit description of a design. From the design, this method selects a candidate sub-network. It then identifies an output function performed by the sub-network. Based on the identified output function, the method identifies a replacement sub-network from a storage structure that stores replacement sub-networks. It then determines whether to replace the selected candidate sub-network with the identified replacement sub-network. If the method determines to replace the selected candidate sub-network, it replaces this sub-network in the design with the identified replacement sub-network. In some embodiments, the selected sub-network has several circuit elements. Also, in some embodiments, the selected sub-network performs a set of two or more functions. The generated parameter is an index into the storage structure in some embodiments.

In some embodiments, this method is performed to map a design to a particular technology library. In some of these embodiments, the selected sub-network can have a directed acyclic graph structure. Also, in some embodiments, the selected sub-network has several output nodes. In addition, some embodiments use this method to map a design that is based on one technology to a design that is based on a second technology.

Some embodiments provide a method for encoding sub-networks that have a set of circuit elements. This method initially defines a plurality of graphs, where each graph has a set of nodes. It then specifies different sets of local functions for each graph, where each set of local function for each particular graph includes one local function for each node of the particular graph, and the combination of each graph with one of the set of local functions specifies a sub-network. The method stores the graph and the local functions. For each particular specified sub-network, the method stores an identifier that specifies the set of particular local functions and the particular graph that specify the particular sub-network.

Some embodiments provide a data storage structure that stores a plurality of sub-networks. Each sub-network performs an output function, and the data storage structure stores each sub-network based on a parameter derived from the output function of the sub-network. In some embodiments, each sub-network performs a set of output functions, and the data storage structure stores each sub-network based on a set of indices derived from the set of output functions performed by the sub-network.

BRIEF DESCRIPTION OF THE DRAWINGS

The novel features of the invention are set forth in the appended claims. However, for purpose of explanation, several embodiments of the invention are set forth in the following figures.

FIGS. 10–13 illustrate an example of a matching determination performed by the query manager.

DETAILED DESCRIPTION OF THE INVENTION

Figure 1:
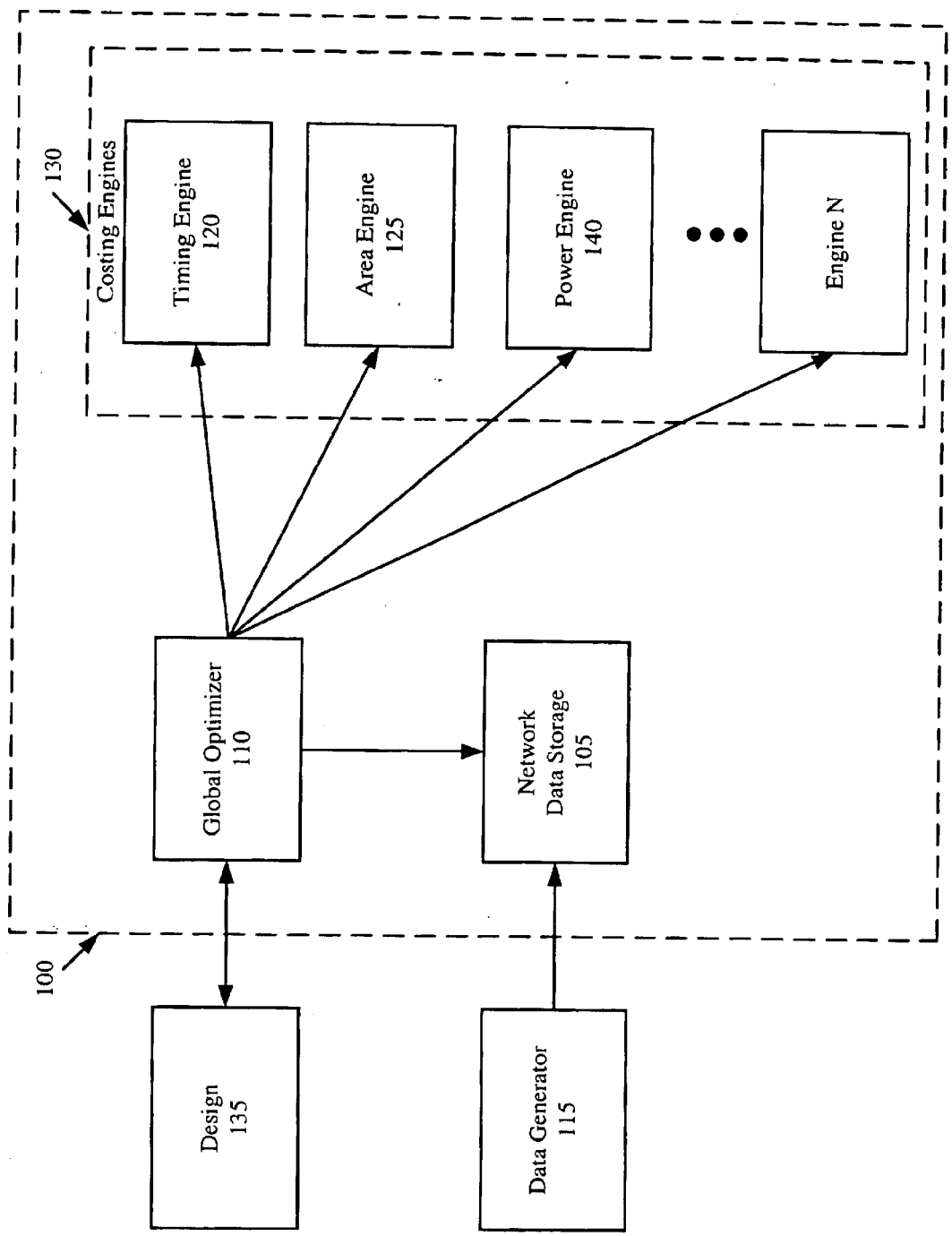
FIG. 1 illustrates the software architecture of a logic synthesizer of some embodiments.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Terminology.

The definitions of several terms in this document are provided below.

IC region refers to the entire IC or a portion (or block) of the IC.

Logical description of a design refers to the logical representation of the design. Examples of logical description include an RTL description (e.g., a Verilog, VHDL, HDL, or BLIFF description), a combinational-logic expression (e.g., a Boolean expression), etc. Circuit description of a design refers to the circuit representation of the design. Examples of circuit description include technology-level designs (also called bound circuit networks), intermediate-level designs (also called unbound circuit networks), etc.

IC designs use a variety of circuit elements. Such elements typically have inputs and outputs. These circuit elements include combinational and sequential elements. A combinational element receives one or more discrete-value inputs and generates one or more discrete-value outputs that depend on the values of the received inputs and on one or more logic functions performed by the combinational element. The outputs of combinational elements do not depend on prior states of the element. Boolean combinational elements are one example of combinational elements. In Boolean combinational elements, the inputs and outputs can have one of two values. Each Boolean combinational element computes one or more Boolean functions. Examples of Boolean combinational circuit elements include low-level elements (e.g., inverters, NAND gates, NOR gates, AND gates, OR gates, XOR gates) or high-level elements (e.g., multiplexors, adders, etc.).

Sequential elements are elements that generate outputs that depend on one or more prior states of the element (e.g., one or more prior values of their inputs and/or outputs). Some sequential elements store values that they receive at their inputs at some time and release these values later (depending on a clock or control signal, etc.). Examples of such elements are latches, registers, flip-flops, RAM, ROMs, etc.

A circuit element that is tied to a specific technology library can be implemented in silicon as a unit with known physical characteristics (e.g., known timing behavior, power consumption, size, etc.). Depending on the underlying technology and design style, a circuit element may correspond to a standard cell, a custom block, an elementary cell of a Gate Array or FPGA, etc.

A technology library (also called a target library) includes standard circuit elements that can be used in a particular technology to implement an IC. Such a library typically includes description of the logical and physical characteristics of its circuit elements. A net is typically defined as a collection of circuit-element pins that need to be electrically connected. A net may be seen as a physical network of wiring (e.g., metal or polysilicon wiring) that connects pins or a purely abstract connection that propagates a logic signal (e.g., a binary signal) from one set of pins to another set of pins. A netlist is a list of nets.

A technology-level design is a circuit description of an IC region. This description is tied to a specific technology library (i.e., it includes only circuit elements from a specific technology library). An intermediate-level design is also a circuit description of an IC region. However, this description is not tied to a specific technology library (i.e., all or some of its circuit elements are not part of any technology library). Rather, the circuit description is in some intermediate format that might be mapped onto a specific target library in a subsequent step. In other words, an intermediate-level output includes circuit elements that are not tied to a specific target library and that compute arbitrary, complex logic functions.

A circuit network refers to a circuit description of multiple IC's, an entire IC, or a portion of an IC. A circuit network can be either a technology-level design or an intermediate-level design. A circuit network that is a technology-level design is a bound circuit network (i.e., its circuit elements are "bound" to a specific technology library). On the other hand, a circuit network that is an intermediate-level design is an unbound circuit network (i.e., its circuit elements are not "bound" to a specific technology library).

A circuit element in a circuit network is also referred to as a node in the network. Each combinational node (i.e., each combinational-logic circuit element) of a circuit network performs a set of combinational-logic functions, each of which is referred to as a local function of the combinational-logic node. When the circuit network is not bound to a specific technology library, the networks circuit elements are typically not associated with physical characteristics (such as size, timing behavior, etc.), and the local functions of the combinational-logic nodes may be arbitrary complex logic functions.

II. Top Level Architecture and Flow

FIG. 1 illustrates the software architecture of a logic synthesizer 100 of some embodiments of the invention. The synthesizer 100 works on circuit networks that may or may not be bound to specific technology libraries. This synthesizer takes as input a circuit network design 135 and optimizes this design with respect to one or more objectives.

Specifically, this synthesizer's generates a modified bound or unbound circuit network that receives the same set of inputs and produces the same set of outputs as the original circuit network supplied to the synthesizer. However, the modified circuit network is superior with respect to the objective or objectives used to optimize the design. For instance, the modified network might have fewer nodes and/or intermediate inputs, or it might be better with respect to physical characteristics (such as size, timing, etc.).

In some embodiments, a user can define the objectives that the synthesizer optimizes. Also, in some embodiments, the synthesizer 100 optimizes the received combinational-logic network design for one or more objectives in view of one or more constraints. Like the objectives, the constraints can relate to the size and depth of the design.

In the embodiment described below, the synthesizer receives combinational-logic-network designs as its inputs. In several examples described below, the combinational-logic network designs are Boolean-network designs. One of ordinary skill will realize that in some embodiments the combinational-logic designs can include multi-value circuit elements that receive inputs and/or generate outputs that can have more than two discrete states.

Also, in other embodiments, the synthesizer 100 receives the starting design in another format. For instance, the synthesizer 100 might receive a logical representation of the starting design (e.g., receives the starting design in logical formats such as Verilog, VHDL, HDL, BLIFF, etc.). In some of these embodiments, the synthesizer uses known techniques to convert received logical representations to circuit networks that it then optimizes.

As shown in FIG. 1, the synthesizer 100 includes a network data storage 105, a global optimizer 110, and one or more costing engines 130. The network data storage 105 stores and manages numerous (e.g., several million) combinational-logic sub-networks that may or may not be tied to specific target libraries.

In some embodiments, the sub-networks stored in the data storage 105 are pre-computed in advance. In some of these embodiments, a data generator 115 pre-tabulates these networks in an automated fashion. Also, in the embodiments described below, this generator is not used during optimization. The network data storage 105 supports queries for alternative implementations of sub-networks in the design. In the embodiments described below, the network data storage is organized as a relational database. However, other embodiments might use different databases (e.g., object-oriented databases), or might use other data storage structures (e.g., data files, etc.), for the data storage 105.

The global optimizer 110 controls the synthesizer's operation by (1) selecting for replacement a candidate sub-network from the design 135, (2) querying the data storage 105 to identify one or more sub-network alternatives for the selected candidate sub-network, (3) analyzing the alternatives, and (4) based on the analysis, determining whether to replace the selected candidate sub-network in the design 135 with an identified alternative.

In some embodiments, the optimizer 110 iteratively performs these four operations until it reaches one or more criteria for stopping. In addition, the optimizer uses one or more of the costing engines 130 to compute costs that will allow the optimizer to analyze the alternative sub-networks retrieved from the data storage. The optimizer 110 can use such costs to assess the alternatives and/or the overall design with respect to one or more objectives and/or constraints.

FIG. 1 illustrates three examples of costing engines 130, which are a timing engine 120, an area engine 125, and a power engine 140 The timing engine 120 computes timing costs for the optimizer in order to guide the optimizer towards generating designs for faster chips. Specifically, when this engine is used, the optimizer informs the timing engine about an alternative that it is considering, and the timing engine in return supplies the optimizer with information about how the alternative would affect the timing behavior of a particular sub-network, the received circuit network, and/or a larger design containing the circuit network. For instance, in some embodiments, the timing engine computes the expected time differential at a certain output if the alternative is selected. In some embodiments, the timing engine uses a user-defined timing model that is appropriate for a certain technology.

The area engine 125 computes and returns an area estimate, which guides the optimizer towards reducing the area of the design. Specifically, when the area engine 125 is used, the optimizer informs this engine about an alternative that it is considering. In turn, the area engine supplies the optimizer with information about how this would affect the area of a particular sub-network, the received circuit network, and/or a larger design containing the circuit network.

The power engine 140 estimates the change of the power consumption when choosing an alternative. Power consumption of an IC is often one of the important factors in designing an IC. The timing engine, area engine, and power engine can be implemented based on any of the known techniques in the art. Other costing engines may also be used when the optimizer needs to consider other objectives and/or constraints.

Figure 2:
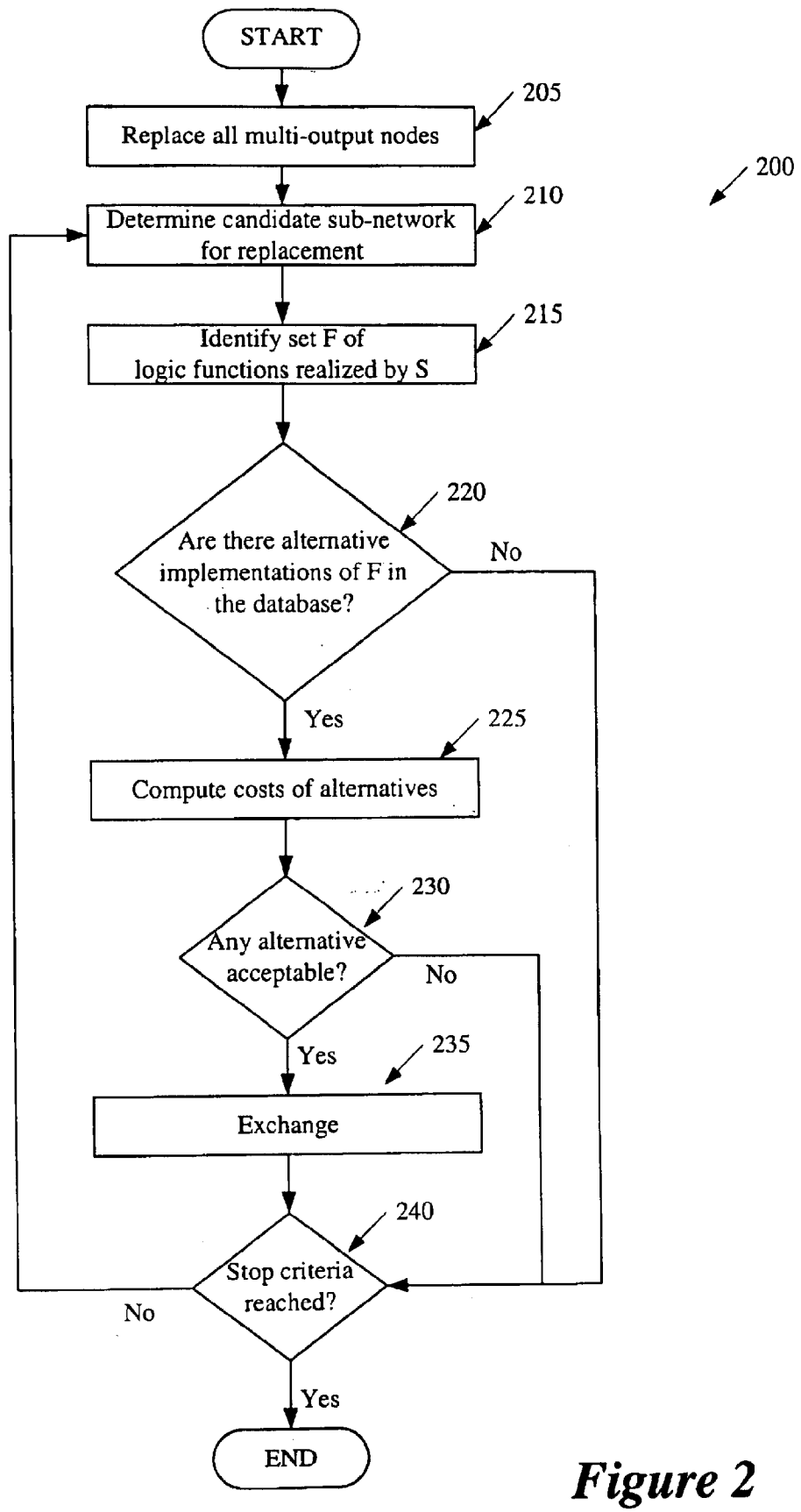
FIG. 2 illustrates a process that conceptually represents the overall flow of the synthesizer of FIG. 1.
Figure 3:
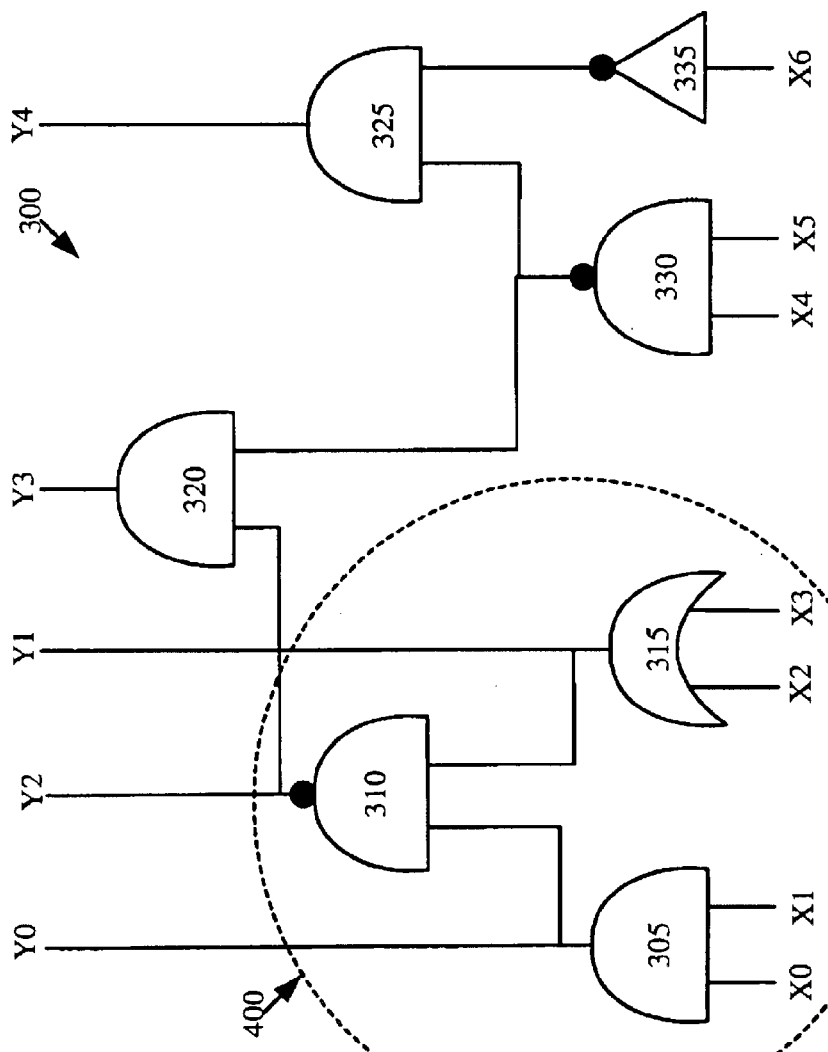
FIG. 3 illustrates an example of a circuit network.

FIG. 2 illustrates a process 200 that conceptually represents the overall flow of the synthesizer 100 of FIG. 1 in some embodiments of the invention. In some embodiments, the optimizer 110 directs this overall flow. The synthesizer 100 performs this process for a circuit network 135 that may or may not be bound to a specific technology library. FIG. 3 illustrates an example of a portion 300 of the circuit network 135. As shown in this figure, the circuit network has several Boolean circuit elements 305–335 (also called nodes) and each circuit element performs a particular function (also called the local function).

In the embodiments described below, the received circuit network 135 is expressed in terms of a linked graph data structure that has one node for each circuit element of the network. Each node is either a combinational or sequential logic node. In some embodiments, each node includes a flag that specifies whether it is a combinational-logic node. For each of its combinational-logic nodes, the received network also specifies a set of local functions. In these embodiments, a reduced order binary decision diagram (ROBDD) expresses each local function of a combinational-logic node.

An ROBDD is a graph data structure that includes nodes and edges, where the nodes represent input or output variables, and the edges represent true or false Boolean results. In some embodiments, an ROBDD is used to express each output function of a combinational-logic node. Accordingly, a combinational-logic node has several ROBDD's associated with it when the node has several output bits. For instance, a three input adder has two ROBDD's, one for each of its two outputs. One of ordinary skill will realize that other embodiments might use other types of BDD's (such as MDD's) or other function representations (such as truthtable representations).

As shown in FIG. 2, the process 200 initially traverses the received circuit network to identify any multi-output combinational-logic node (such as a three-input adder), i.e., to identify any combinational-logic node that performs two or more local functions. If the process finds any such node, it replaces this node with a set of single-output combinational-logic nodes.

The process 200 can perform this replacement by using any known techniques in the art. For instance, it can replace the multi-output combinational-logic node with several single-output nodes, where each single-output node performs one local function. For each particular output function performed by the multi-output node, the process initially tries to identify a sub-network (of one or more nodes) stored in its data storage 105 that performs the particular output function; the process for identifying whether the data storage stores a sub-network is described below by reference to FIGS. 5–17. If the process 200 cannot identify a pre-tabulated sub-network for a particular output function of the multi-output node, the process decomposes this function into simpler functions, and then identifies sub-networks stored in the data storage that perform the simpler functions. The process can use any known decomposition process, such as the Shannon expansion, which is discussed in Giovanni De Micheli, Synthesis and Optimization of Digital Circuits, McGraw-Hill, 1994, or the Reed-Muller expansion, which is described in "Some classical mathematical results related to the problems of the firmware/hardware interface," by T. C. Wesselkamper, Proceedings of the eighth annual workshop on Microprogramming, Chicago, 1975 (available in the ACM Digital Library). Once the process 200 identifies a sub-network for each output function of the multi-output node, the process replaces the multi-output node with the identified set of sub-networks. Specifically, in the received circuit network, the process replaces the multi-output node with several replacement nodes that represent the nodes of the identified set of sub-networks. For each replacement node, the process specifies the node's local function in terms of its ROBDD.

After replacing each multi-output node with a set of single-output nodes, the process in some embodiments associates the set of single-output nodes (e.g., links them, identifies their association in a list, or uses some other association technique). This association can then be used during the selection of candidate sub-networks for replacement (at 210, which is described below), in order to identify and select the entire node set that represents a multi-output node. This selection would allow the entire node set of the multi-output node to be optimized alone or in conjunction with other combinational-logic nodes. The collective optimization of the entire node set of a multi-output node is especially beneficial when the data storage stores a desired implementation of the multi-output node.

One of ordinary skill will realize that although the process 200 decomposes a multi-output node into a set of single-output nodes, other embodiments might address multi-output nodes differently. For instance, some might simply not select such nodes for optimization. Others might handle them without any decomposition: For example, the process 200 might try to find alternatives (at 220) based solely on the combinational-logic functions of the candidate sub-network identified at 215. Accordingly, other embodiments may use any kind of representation of the circuit network—including multi-output nodes—so long as the combinational-logic functions realized by a sub-network can be computed.

After 205, the process 200 selects (at 210) a combinational-logic-sub-network S in the circuit network 135. The selected sub-network S is a candidate sub-network for replacement. This selected sub-network is also a combinational-logic network, which means that each of its nodes is a combinational-logic node.

In some embodiments, the process 200 selects (at 210) the candidate sub-network S through a random growth process. Numerous such random-growth processes are known in the art. Several such processes randomly pick a combinational-logic node in the circuit network and then randomly pick other combinational-logic nodes that are connected to the first selected combinational-logic node or the subsequently selected combinational-logic nodes, until they reach a certain sub-network complexity (e.g., until the total number of input variables to the sub-network falls within a certain range). At any point in the growth of the candidate sub-network that encounters a sequential-logic node in the circuit network, the growth is terminated at that point (i.e., that point becomes an input or output of the candidate sub-network). Once the growth is terminated at a particular combinational-logic node, the growth might be continued at other nodes of the specified candidate sub-network until the desired level of complexity is achieved.

In some instances, the sub-network identified at 210 has multiple outputs (i.e., the identified sub-network performs multiple functions). In some embodiments, the random-growth process ensures that the selected sub-network S has at least one output dependent on all the inputs of the sub-network. Such a criteria is used in these embodiments in order to facilitate the database indexing, as further described below.

Figure 4:
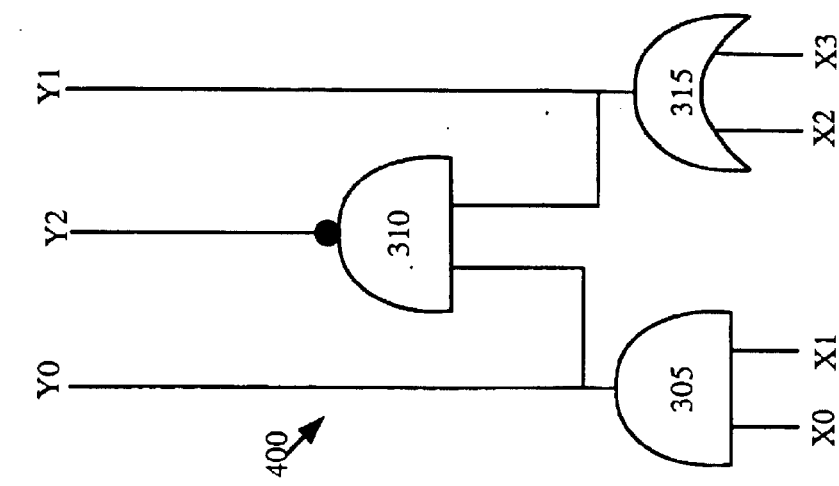
FIG. 4 illustrates an example of a combinational-logic sub-network of the circuit network of FIG. 3.

FIG. 4 illustrates an example of a combinational-logic sub-network 400 that is selected from the circuit network that is partly illustrated in FIG. 3. The sub-network 400 illustrated in FIG. 4 has four inputs X0–X3, three circuit elements 305–315, and three outputs Y0–Y2. The three circuit elements are an AND gate 305, a NAND gate 310, and an OR gate 315. The combinational-logic expressions for the three functions represented by the three outputs of the selected sub-network are:

$$Y0 = X0 \cdot X1; \tag{1}$$

$$Y1 = X2 \oplus X3; \tag{2}$$

$$Y2 = \overline{(X0 \cdot X1)} \cdot (X2 \oplus X3). \tag{3}$$

In the sub-network 400, the output Y2 depends on all the inputs X0–X3 of the sub-network.

After 210, the process 200 identifies (at 215) a set of combinational-logic functions F realized by the selected candidate sub-network S. The identified set F includes only one logic function F0 when the selected sub-network S has only one output. On the other hand, the identified set F includes several logic functions F0 . . . FM when the selected sub-network S has several outputs Y0 . . . YM.

The set of output functions F can come from two different types of circuit elements. The first type is a circuit element that does not receive the output of any other circuit elements in the candidate sub-network S selected at 210. In other words, all the inputs of the first-type circuit element are inputs to the selected candidate sub-network S. The second type is a circuit element that receives the output of at least one other circuit element in the selected candidate sub-network S. Some or all of the second-type element's inputs are from other circuit elements in the selected candidate sub-network S.

The candidate sub-network's output function that comes from a first-type circuit element is just the local function of the first-type circuit element. For instance, in the example illustrated in FIG. 4, the sub-network outputs Y0 and Y1 come from first-type elements 305 and 315. As recited by equations (1) and (2) above, these outputs are just the local functions of the AND gate 305 and the OR gate 315.

On the other hand, the function that is supplied at the output of a second-type circuit element has to be derived. Such a function is derived from the local functions of the second-type circuit element and the circuit element or elements whose output or outputs the second-type circuit element receives. For instance, in the example illustrated in FIG. 4, the sub-network outputs Y2 come from second-type elements 310. As recited by equations (3), this output is derived from the local functions of NAND gate 310 and the local functions of the AND gate 305 and the OR gate 315.

As mentioned above, each output function is represented by an ROBDD in the embodiments described below. In some of these embodiments, the process 200 uses the BuDDy® software package to identify the ROBDD representation of each function in the set of combinational-logic functions F realized by the candidate sub-network S selected at 210.

Specifically, the process 200 traverses the graph data structure of the selected candidate sub-network to examine each node in the combinational-logic sub-network. The process 200 starts with the first-type of nodes (i.e., the nodes that do not receive the output of any other nodes). For each of these nodes, the process provides the BuDDy package with the node's local function (in form of an ROBDD) and its inputs in the received sub-network. The BuDDy package then identifies the node's output function, which is essentially its local function after it has been modified to account for the representation of its inputs in the combinational-logic sub-network.

After identifying with all the first-type nodes, the process steps through the second-type of nodes (i.e., the nodes that receive the output of at least one other node) in a manner that ensures that it selects each second-type node after it has identified the ROBDD of the set of nodes that supply their output to this node. For each selected second-type node, the process 200 provides the BuDDy package with the node's local function (in ROBDD format), the node's inputs in the sub-network, and the ROBDD's of the set of nodes that supply their outputs to the node. The BuDDy package then identifies the node's output function (in an ROBDD format) based on the received information.

Information about the BuDDy package can be obtained from Join Lind-Nielsen, Computer Systems Section at the Department of Information Technology, Technical University of Denmark, who may be contacted by email or through the University website.

One of ordinary skill will realize that other embodiments might identify the realized set of combinational-logic functions differently. For instance, some embodiments might use other software packages, such as the CUDD package provided by the University of Colorado. Yet other embodiments might not use the ROBDD representation for the combinational-logic functions. Some embodiments might use the truthtable representation, or some other representation. Still other embodiments might use other BDD variants.

After 215, the process 200 queries (at 220) the network data storage 105 to determine whether it has stored one or more alternative sub-networks that implement the combinational-logic function set identified at 215. The network data storage converts the identified combinational-logic function set to a parameter based on which one or more alternative sub-networks might have been stored in the data storage. Accordingly, the network data storage uses this parameter to try to identify one or more alternative sub-networks in the data storage.

In the embodiments described below, the data storage 105 is a database, and the parameter generated by the network database is a set of integer indices into database tables that store the pre-tabulated sub-networks. The network database uses these indices to retrieve any alternative sub-network C that is stored in the database according to the generated set of indices. The operation of the network database in response to the query at 220 will be further described below by reference to FIGS. 5–17. One of ordinary skill will realize that other embodiments might use different storage structures (e.g., data files) and/or different storage parameters (e.g., string indices).

If the process determines (at 220) that the network database 105 does not store any alternative sub-network C that implements the combinational-logic function set identified at 215, it transitions to 240, which will be described below. On the other hand, if the process identifies one or more such alterative sub-networks, it uses (at 225) one or more of the costing engines 130 to compute costs for the candidate sub-network selected at 210 and for each alternative sub-network identified at 220.

The costing engines can estimate actual physical costs when the synthesizer 100 is optimizing a design that is bound to a specific technology. For instance, the area engine 125 might estimate a candidate or alternative sub-network's total area, the number of circuit elements, etc. The timing engine 120 might estimate the sub-network's timing behavior, delay, etc. The power engine 140 might estimate the power consumption of a sub-network.

On the other hand, when the synthesizer is working on an unbound design, the optimizer 110 uses one or more costing engines that compute more abstract costs of the candidate or alternative sub-networks. For instance, an area engine 125 might measure the "size" of an unbound sub-network by some estimate of its final area, by the number of its lowest-level and intermediate-level inputs, by the number of variables within the functions performed by the sub-network's circuit elements, or by some other abstract quantification. Another costing engine might estimate the "depth" of a sub-network as the number of stages of the sub-network plus an estimate about the internal depth of each circuit element. The optimizer might also use such abstract costing engines for bound designs.

In some embodiments, the optimizer uses just one of the costing engines (e.g., uses only the timing engine 120 or the area engine 125) to compute only one cost (e.g., to compute only a timing cost or an area cost) for each candidate or alternative sub-network. In other embodiments, the optimizer uses several costing engines (e.g., uses both the timing and area engines) to compute several costs for each sub-network at issue. In some of these embodiments, the costs generated for each sub-network are combined in a weighted or unweighted fashion into a single cost for the sub-network, while in other embodiments they are not.

Based on the computed costs, the process 200 next determines (at 230) whether any identified alternative sub-networks is acceptable. This determination depends on the type of optimization that the optimizer 110 performs. For instance, certain types of optimizations (such as local optimization) do not accept alternative sub-networks that have worse cost than the original sub-network identified at 210. Other optimization techniques (such as simulated annealing) do accept alternative sub-networks that have worse calculated costs, but decrease the cost penalty (i.e., decrease the number of bad exchanges) that they are likely to accept as the number of iterations of process 200 increases.

The determination (at 230) of whether any identified alternative is acceptable might be based solely on optimizing an objective function, or it might be based on optimizing an objective function within a certain constraint. In addition, the objective function might be associated with only one computed cost or with a (weighted or unweighted) combination of several computed costs. Similarly, the constraints, if any, might be associated with only one computed cost or with several computed costs. Examples of objective functions include an area costing function and a timing costing function, both of which can be computed at 225. Another example of an objective function can be a costing function that produces a weighted combination of an area cost and a timing cost. Such a function can be computed at 225, or it can be computed at 235 based on costs computed at 225. Examples of constraints can include maximum area, time, depth constraints, and/or maximum power consumption.

If the process 200 does not find any alternative sub-network acceptable at 230, it transitions to 240, which will be described below. On the other hand, if the process finds one or more alternative sub-networks acceptable at 230, it then exchanges (at 235) the sub-network identified at 210 with one of the acceptable alternative sub-networks. If more than one alternative sub-networks are acceptable, the process 200 randomly selects one of the acceptable sub-networks. One of ordinary skill will realize that other embodiments might choose the best sub-network with respect to the costing, or might choose randomly one out of the k best ones, where k is a user-defined parameter. After 235, the process transitions to 240.

At 240, the process determines whether it has reached a criterion for stopping. If not, it transitions back to 210 to identify another candidate sub-network S and to repeat the subsequent operations for this sub-network. Otherwise, the process 200 ends.

In different embodiments of the invention, the optimizer uses different criteria for stopping. For instance, this criterion might relate to the number of iterations performed by the process 200 without identifying a better alternative sub-network. Alternatively, it might simply relate to the overall number of iterations.

The criterion for stopping at 240 depends on the type of optimization that the optimizer 110 performs. One type of optimization is simulated annealing, which is described in many publications, such as Nahar, et. al., Simulated Annealing And Combinatorial Optimization, Proceedings of the 23 Design Automation Conference, 1986.

The pseudo code for the optimization process 200 when it uses a version of simulated annealing is as follows:

```
S:= S_0 (S_0 is initial solution)
T := T_0 (T_0 is the initial temperature)
Inner_Loop_Count := Outer_Loop_Count := 0
Inner_Loop_Max := i_0 (maximum number of iterations of inner loop)
Outer_Loop_Max := i_max (maximum number of iterations of
outer loop)
Repeat
    Repeat
        Increment Inner_Loop_Count and Outer_Loop_Count by 1;
        Identify candidate sub-network, CanS, for replacement;
        //See 210 of FIG. 2
        Identify set of functions F; //See 215 of FIG. 2;
        Call query manager for replacement candidates; //See 220 of
        FIG. 2;
        If any replacement returned,
            Cost each replacement, //See 225 of FIG. 2;
            If at least one replacement acceptable, then randomly select
            one of the acceptable replacements as NewS//See of FIG. 2;
            If (h(NewS) ≦ h(CanS)) or
            (Random < exp( (h(CanS)-h(NewS)) / T) ), //See
        230 of FIG. 2;
            Then replace CanS with NewS //See 235 of FIG. 2;
    Until (Inner_Loop_Count = Inner_Loop_Max) or
        (Outer_Loop_Count = Outer_Loop_Max)
    T := alpha * T; Inner_Loop_Max = beta * Inner_Loop_Max; Reset
    Inner_Loop_Count
Until Outer_Loop_Count = Outer_Loop_Max //See 240 of FIG. 2;
```

In this pseudo code, $T\_0$, $i\_0$, $i\_max$, alpha, beta are parameters for the simulated annealing algorithm. These parameters might be specified by a user or set by the optimizer. In some embodiments, alpha equals 0.98, and beta equals 1.1. The selection of the annealing parameters is well studied. One scheme for specifying these parameters is disclosed in "A Comparison of Annealing Techniques for Academic Course Scheduling," by M. A. Saleh Elmohamed, et al., published at 2nd international conference, PATAT97. See also, e.g., "Simulated Annealing and Combinational Optimization," by Surendra Nahar, et al., University of Minnesota, 23 Design Automation Conference, pp. 293–299. Also, several software packages are available for determining the parameters for simulated annealing. One such package is ASA, written by Lester Ingber, who may be contacted through the internet.

The evaluation function h( ) is performed by one of the costing engines, such as the timing engine. Random is a random value within the interval [0,1) that is generated within each pass of the inner return loop. Also, in the example above, the stopping criterion is the overall number of iterations, which is recorded by the Outer_Loop_Count.

In some embodiments, after the process 200 terminates, the global optimizer maps the optimized circuit network into a technology-level description, if the circuit network is not at that level already. In other words, if the optimized circuit network is not bound to a specific technology library, the global optimizer 110 in some embodiments converts the network into a technology-level network by using standard techniques for performing such conversions. In some of these embodiments, the global optimizer performs this technology mapping by repeating the process 200 except this time it uses a database that is tied to the target technology library (i.e., uses a database that stores only sub-networks that are made up only of circuit elements from the target technology library). Such technology mapping will be further described below in Section V.

The following discussion initially describes in Section III the operation of the network database 105 in response to search query at 220. Several processes for offline generation of sub-network candidates and the storage of these candidates in the database 105 are then described in Section IV. These processes are performed by the data generator 115 and the network database 105.

III. Network Database

The network database 105 is designed to store a large number (e.g., millions) of sub-networks, and to support queries for the stored sub-networks. In the embodiments described below, this database has the following features. First, it stores each sub-network completely along with full information about the logic function or functions performed by the sub-network. Second, in the embodiments described below, each stored sub-network includes one or more circuit elements, each of which can be independently analyzed (e.g., independently examined, replaced, etc.) by the global optimizer. In other words, the circuit elements of each sub-network do not need to be treated as one entity but rather can be treated as separate elements. In other embodiments, a stored sub-network might include several circuit elements that are part of an unbreakable block that the synthesizing optimizer needs to analyze as one entity.

Third, the stored sub-networks are machine generated in order to exploit the space of all existing networks up to a given size. For instance, in some embodiments, the stored sub-networks cover any implementation of any logic function that can be realized with networks up to a given complexity (e.g., up to the complexity of seven 2-input circuit elements). This is far superior to an approach that only stores alternative implementations of functions that are derived from expert knowledge.

Fourth, the network database uses new encoding schemes for the sub-networks that make it possible to store large number of sub-networks efficiently. Fifth, this database uses an indexing scheme that efficiently uses memory and CPU time. This indexing scheme transforms the problem of multi-valued logic function matching into a relational database system that is based on sets of integer primary and secondary indices. Accordingly, the network database can use any method from standard relational database systems for fast search and retrieve. Fifth, the database may reside either on disk or in physical memory or partially on both media (e.g., by using a filein/fileout swapping mechanism).

Figure 5:
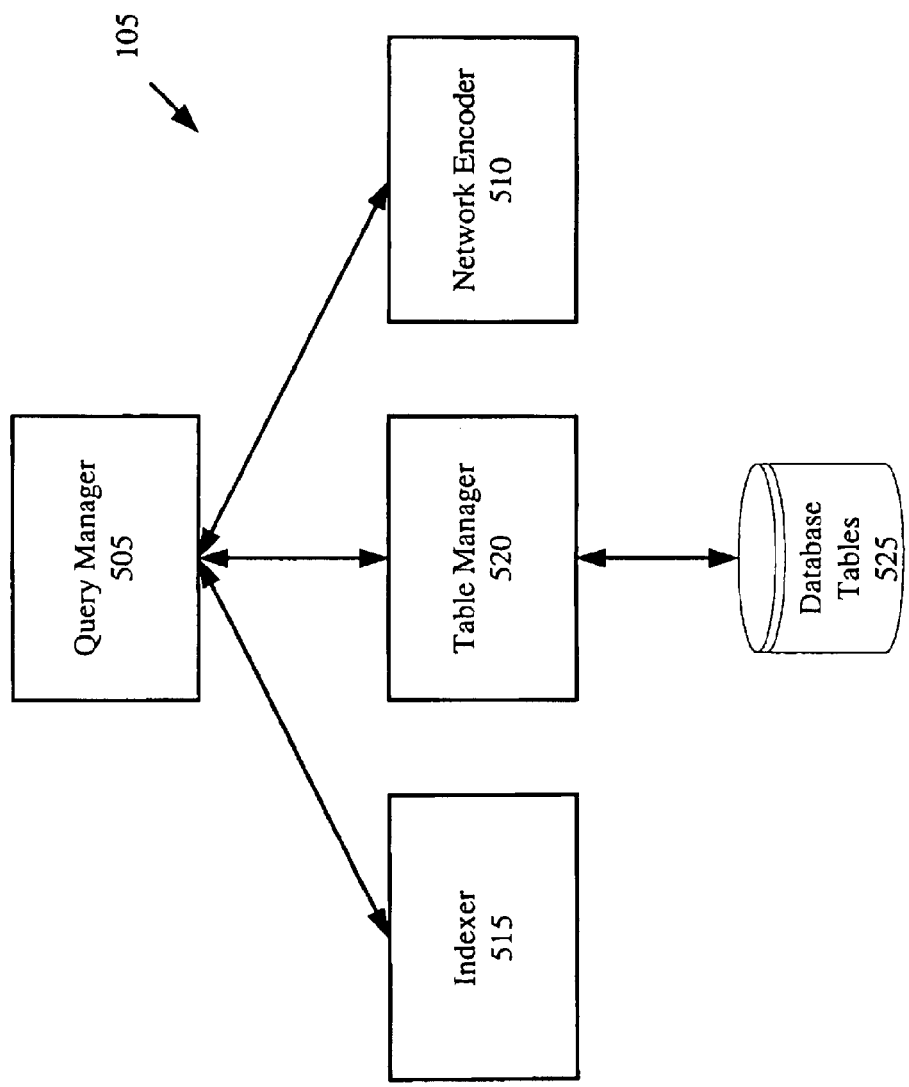
FIG. 5 illustrates a block diagram of a network database that is used by the logic synthesizer of FIG. 1.

FIG. 5 illustrates a block diagram of the network database 105 in some embodiments. As shown in this figure, the database includes a query manager 505, a network encoder 510, an indexer 515, a table manager 520, and database tables 525.

A. Query Manager

From the global optimizer 110, the query manager 505 receives a query for one or more sub-networks that perform a set F of combinational-logic functions. The received set of combinational-logic functions might include one function $F\_1$ or several functions $F\_1, \ldots, F\_M$. In the embodiments described below, each combinational-logic function in the received set is in a ROBDD format, although one of ordinary skill will realize that other formats (such as truth tables, symbolic forms, other types of BDD's, etc.) can be used to represent the received combinational-logic functions.

In response to the received query, the query manager 505 interacts with the network encoder 510, indexer 515, and table manager 520 to try to identify a set of sub-networks that are stored in the database table 525 and that match the query. In other words, the query manager tries to identify pre-tabulated sub-networks that compute (i.e., realize) all the functions in the received set of functions.

Figure 6A:
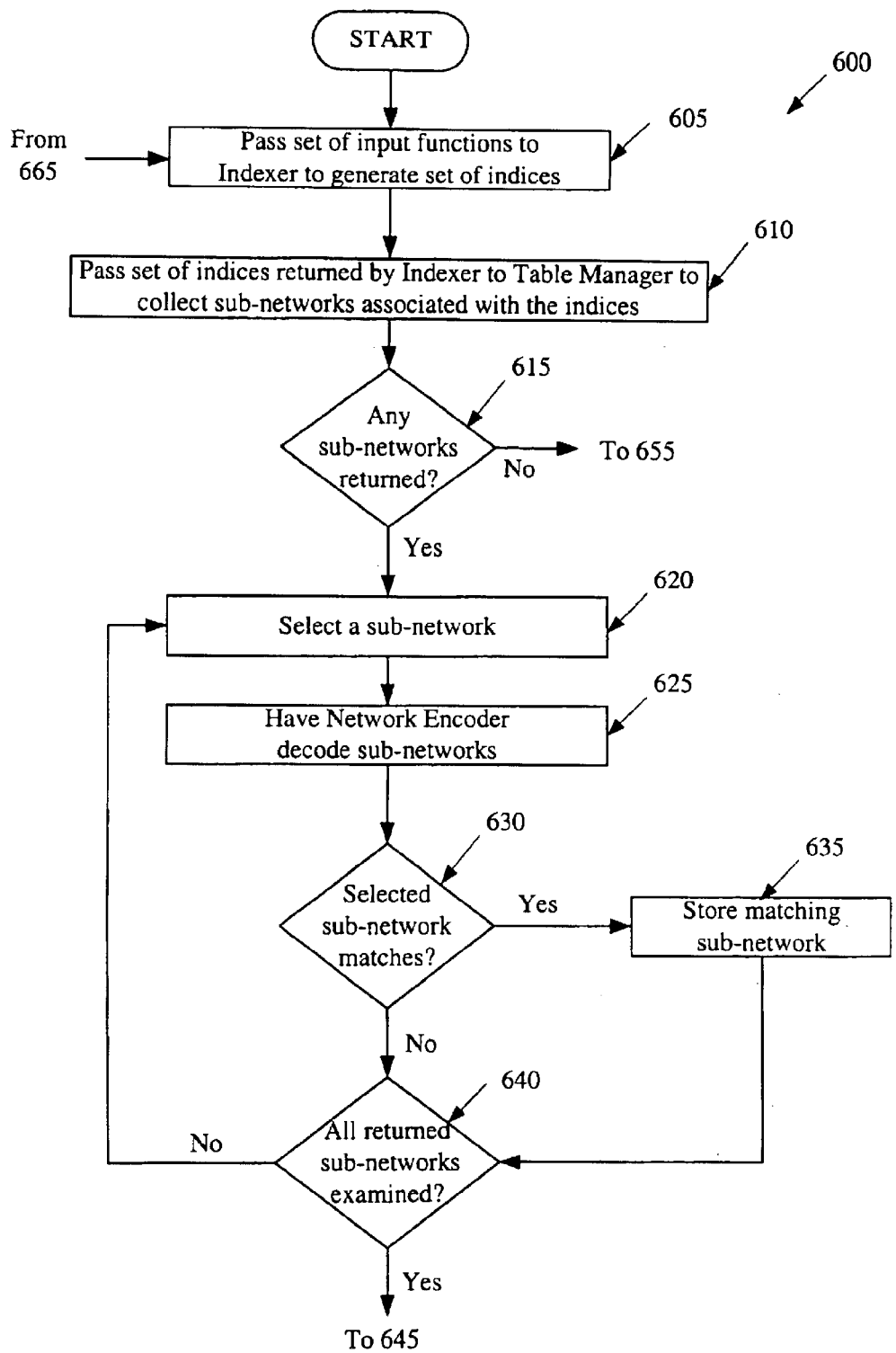
FIG. 6 illustrates a process that a query manager performs to respond to a received query for a set of combinational-logic functions.
Figure 6B:
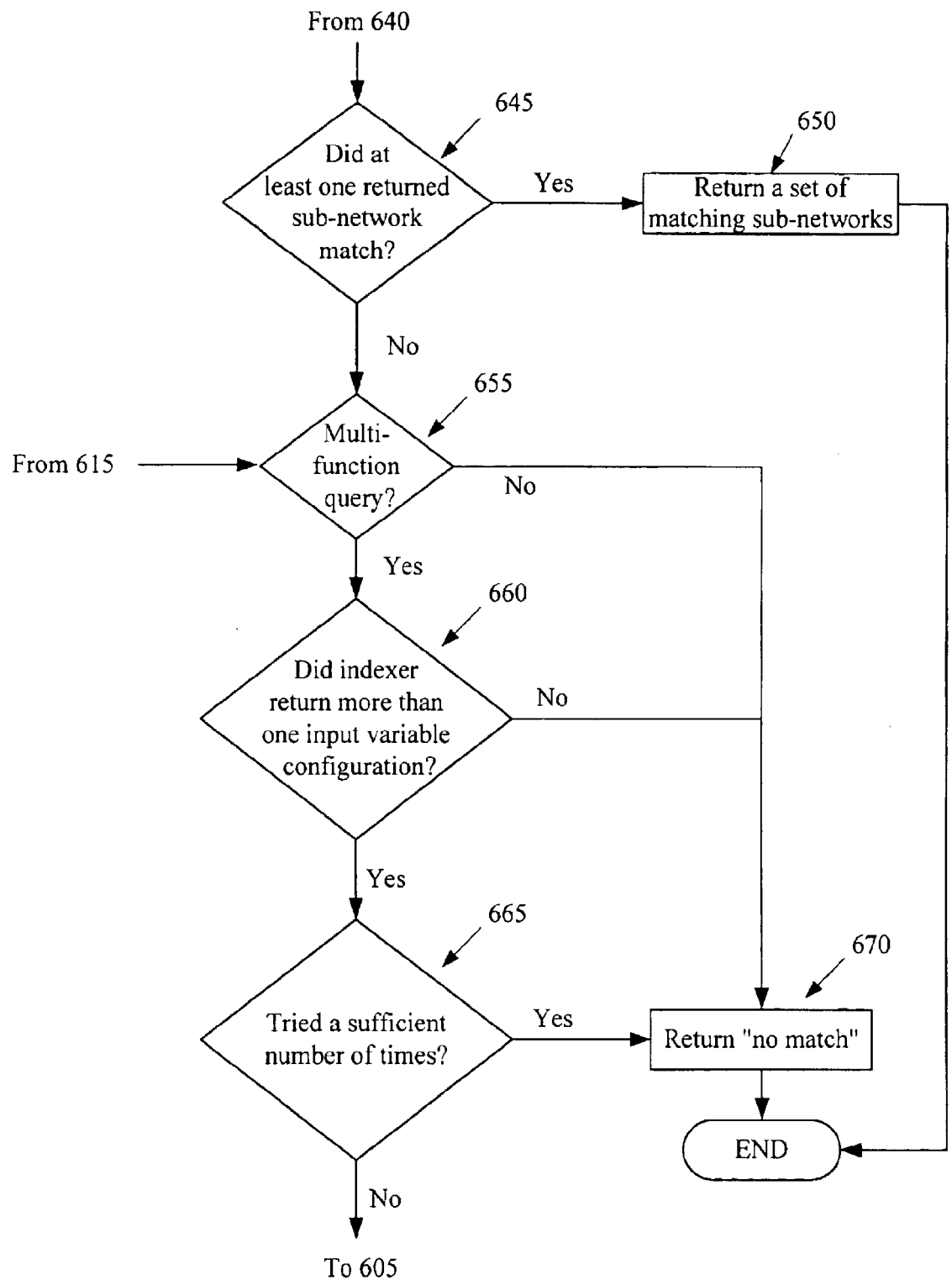

FIG. 6 illustrates a process 600 that the query manager performs to respond to a received query for a set F of combinational-logic functions. As shown in FIG. 6, the query manager initially passes (at 605) the received set of input functions to the indexer 515. This indexer translates each of the functions into an integer index into the database tables 525.

In other words, the indexer 515 generates a set of one or more indices I from the set of one or more functions F. In the embodiments described below, the indexer converts a single-function query F_1 into a single index I_1 into the network database, and this single index identifies a set of one or more sub-networks that realize the function of the query. For a multi-function query, this indexer selects one of the functions as a pivot function, specifies an input variable order based on this pivot function, and generates an index for this pivot function. When there are more than one pivot functions in a query, the indexer randomly selects among the pivot functions. Also, when there are several input variable orders (also called input variable configurations below) that can be specified for a pivot function, the indexer randomly selects among the viable input variable configurations. Based on the specified input variable order of the pivot function, the indexer generates an index for each of the non-pivot functions of the query. The indexer 515 is described further below by reference to FIGS. 7–9.

Once the indexer returns (at 605) the set of indices I, the query manager 505 passes (at 610) this set to the table manager 520. The table manager 520 interacts with the database tables 525 that store pre-tabulated sub-networks that are sorted based on set of indices. In the embodiments described below, the database tables use a relational database scheme to store all sub-networks together with their associated indices. In some embodiments, the database tables also store for each stored sub-network some additional data, such as actual or estimated size or speed of the sub-network. In addition, the sub-networks are stored in these tables in an encoded form.

Based on the received set of indices I, the table manager 520 tries to retrieve a set of pre-tabulated replacement sub-networks from the database tables 525. If the table manager successfully retrieves replacement sub-networks from the database tables, the table manager might also retrieve additional parameters (such as estimated or actual size or speed) that are stored in the database for each replacement sub-network. The global optimizer can use such parameters to decide whether to replace the selected candidate sub-networks with replacement sub-networks retrieved from the database. The operation of the database table 520 and the table manager 515 are further described by reference to FIGS. 15-17.

After 610, the query manager determines (at 615) whether the table manager returned any replacement sub-network for the set of indices it received at 610. If not, the process transitions to 655, which will be explained below. Otherwise, the query manager selects (at 620) one replacement sub-network retrieved by the table manager at 610.

The replacement sub-networks retrieved by the table manager are in an encoded form. Accordingly, the query manager directs (at 625) the network encoder 510 to decode the replacement sub-network selected at 620. The network encoder decodes this sub-network into (1) a linked graph data structure that has one node for each circuit element of the sub-network and one edge for each connection between the circuit elements of the sub-network, and (2) a local function for each node in the graph structure. Also, each local function is represented by an ROBDD in some embodiments. The network encoding and decoding used in some embodiments are further described in detail in Section III.D.

After decoding the replacement sub-network selected at 620, the query manager determines (at 630) whether the replacement sub-network selected at 620 matches the candidate sub-network selected at 210. In the embodiments described below, the replacement sub-network matches the candidate sub-network only if the replacement sub-network performs all the output functions of the candidate sub-network (i.e., all the functions in the set of functions F identified at 215 for the candidate sub-network) for a particular input variable configuration of the replacement sub-network. This determination of the query manager requires understanding of the operation of the indexer 515. Accordingly, this determination will be described below in sub-section III.B.4, after the indexer's operation is described below in sub-section III.B.1–3. Also, sub-section III.B.4 explains why the query manager even needs to check whether the replacement sub-network performs all the output functions of the candidate sub-network.

If the query manager determines (at 630) that the replacement sub-network selected at 620 does not match the candidate sub-network selected at 210, the query manager transitions to 640, which will be further described below. However, if the selected replacement sub-network matches the selected candidate sub-network, the query manager adds (at 635) the matching replacement sub-network to a set of matching replacement sub-networks. From 635, the query manager transitions to 640.

At 640, the query manager determines whether it has examined all the sub-networks retrieved by the table manager at 610. If not, the query manager returns to 620 to select another retrieved sub-network that it has not yet examined and to repeat its above-described subsequent operations for this sub-network.

When the query manager determines (at 640) that it has examined all the replacement sub-networks retrieved by the table manger, the query manager determines (at 645) whether at least one of the retrieved replacement sub-networks matched the selected candidate sub-network (i.e., determines whether the set of matching replacement sub-networks includes at least one replacement sub-network).

If so, the query manager then returns (at 650) a set of the matching replacement sub-networks to return to the global optimizer, and then ends. In some embodiments, the query manager receives from the global optimizer parameters (e.g., user-defined parameters) that specify the maximum number of sub-networks to return to the global optimizer. In these embodiments, the query manager uses (at 650) these parameters to select the sub-networks that it wants to return to the optimizer from the set of matching sub-networks. Alternatively, in other embodiments, the query manager (1) might randomly select one or more matching sub-networks to return, (2) might select all matching sub-networks, or (3) might select all matching sub-networks that do not have more than a specified number of nodes.

On the other hand, if the query manager determines (at 645) that no retrieved replacement sub-network matched the selected candidate sub-network, the query manager transitions to 655. As mentioned above, the query manager also transitions to 655 from 615 when the table manager fails to retrieve any sub-network at 610. From either 615 or 645, the query manager ends up at 655 when it fails to identify a matching pre-tabulated sub-network for the candidate sub-network selected at 210.

This failure might be because the query manager cannot confirm that any retrieved replacement sub-network performs the set of output functions of the selected candidate sub-network. Alternatively, this failure might be due to the indexer's choice for the input variable configuration. As mentioned above, when the indexer has to generate multiple indices (i.e., when the candidate sub-network performs several output functions), the indexer selects an input variable configuration as the basis for the indices. This selection is further described below in Section III.B. If the indexer's selection does not match the input variable configuration selected during the pre-tabulation of the sub-networks in the database, the set of indices generated by the indexer during the run-time optimization operation might not return matching replacement sub-networks (i.e., might not return any replacement sub-network, or might return replacement sub-networks that do not satisfy the two matching criteria of 630).

Accordingly, the query manager performs 655, 660, and 665 to reduce the possibility that the failure to match is because of the indexer's choice of input variable configuration. Specifically, at 655, the query manager determines whether the query was a multi-function query. If not, the failure to find a match is not because of the choice of input variable configuration. Accordingly, the process informs (at 670) the optimizer 110 that it could not find a matching sub-network for the selected candidate sub-network (i.e., could not find any viable pre-tabulated replacement sub-network that performs the same function as the candidate sub-network) and then ends its operation.

On the other hand, if the process determines (at 655) that the function is a multi-function query, the query manager determines (at 660) whether the indexer specified the existence of more than one input variable configuration when it returned the set of indices at 605. When the indexer has not specified this, the failure to identify a matching sub-network is not due to the indexer's choice of input variable configuration. Accordingly, the query manager transitions from 660 to 670, where it informs the optimizer 110 that it could not find a matching sub-network for the selected candidate sub-network. The query manager then ends its operation.

Alternatively, when the indexer specified (at 605) more than one input variable configuration, the query manager transitions to 665 from 660. At 665, the query manager determines whether it has tried a sufficient number of times to get from the indexer a set of indices that results in a matching sub-network. In some embodiments, the query manager uses a function T to specify the number of times that it should try to obtain sets of indices from the indexer. This function returns an integer that is dependent on the number N of input variable configurations specified by the indexer at 605. It should be noted that the indexer might return a different number N each time at 605 for a different pivot function.

If the function T equals N when it receives N (i.e., if T(N)=N), then the expected number of times that the query manager tries each possible input ordering is once, given that the indexer randomly chooses an input variable configuration each time. To speed up the process, some embodiments define $$T(N)=\min[10, (N/\text{constant})],$$

where the constant is at times set to something in the range from 5–10. Yet other embodiments (1) specify a likelihood "p", 0<p<=1, for the query manager and the indexer to find an input configuration that matches the configuration used during the pre-tabulation, and then (2) define T(N)=N*p.

Still other embodiments might have the query manager and indexer deterministically search through possible input variable configurations in hope of finding an input variable configuration used during pre-tabulation to store a particular sub-network. However, such an approach is more time-consuming. This time consumption is problematic when there are no matching sub-networks in the database for any of the input variable configurations. It is also especially problematic when the number of input configurations is relatively large (e.g., for totally symmetric pivot functions like a n-way AND).

If the query manager determines (at 665) that it has not asked the indexer to generate sets of indices for more than the number of times specified by function T, it transitions back to 605 to direct the indexer again to generate a set of indices. As mentioned above and further described below, the indexer generates the set of indices by randomly selecting a viable pivot function and a viable input variable configuration for this pivot function. Consequently, the next generated set of indices might result in the identification of a set of replacement sub-networks that match the selected candidate sub-network.

If the query manager determines at 665 that it has unsuccessfully tried a sufficient number of times to identify a matching replacement sub-network, it informs (at 670) the optimizer 110 that it could not find a matching sub-network for the selected candidate sub-network (i.e., could not find any viable pre-tabulated replacement sub-network that performs the same set of functions as the candidate sub-network, and then ends its operation.

B. Indexer

In order to search for sub-networks that realize one or more logic functions, it is necessary to have an efficient indexing scheme for storing these sub-networks. This scheme must be capable of returning flawlessly, or with a high probability, all sub-networks that match a specific query.

The indexer 515 facilitates such an indexing scheme. Specifically, the indexer maps combinational-logic functions to database indices. As for relational databases, the term index denotes an elementary data type (e.g., integers or strings) that can be stored, sorted, and compared. In the embodiments described below, each index is an integer.

The embodiments described below uses a direct indexing scheme that can identify single-output or multi-output sub-networks (i.e., sub-networks that realize one function or multiple functions). Each time the indexer 515 receives a single-function or multi-function query from the query manager, this indexer converts each function in the received query to an integer index into the database tables 525. The generated set of indices can then be used to search the network database (like an ordinary relational database) for all entries (i.e., all sub-networks) that are associated (i.e., related) with each index in the generated set.

Figure 7:
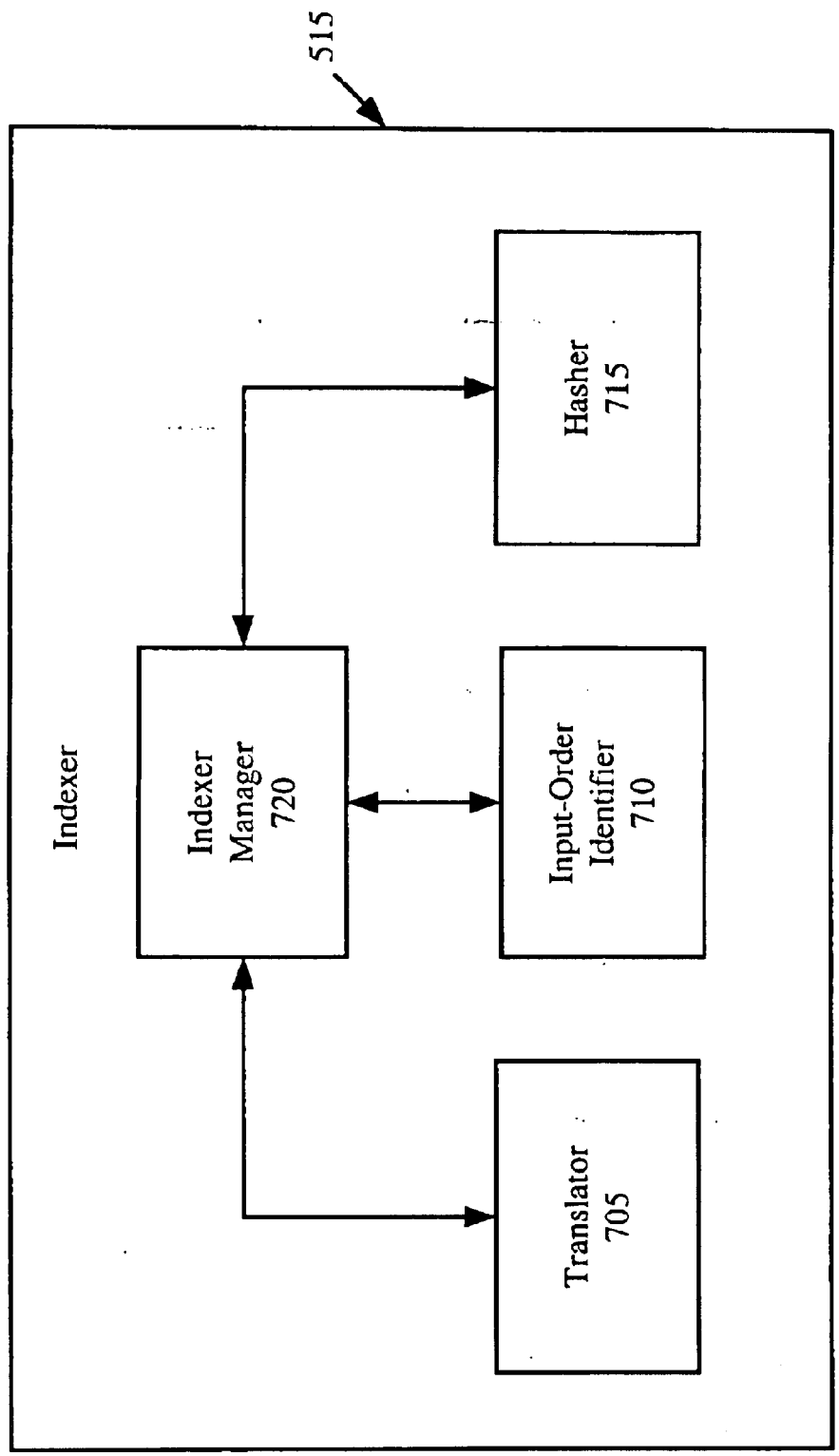
FIG. 7 illustrates the components of an indexer that is used in some embodiments.

FIG. 7 illustrates the components of the indexer 515 in some embodiments. As shown in this figure, this indexer includes a translator 705, an input order identifier 710, a hasher 715, and an index manager 720. This indexer can be used during the pre-tabulation of sub-networks, or during run-time optimization of a network. In each instance, the indexer generates a set of indices for a received set of functions. The generated set of indices is used to store the generated sub-networks during pre-tabulation and is used to retrieve pre-tabulated sub-networks during optimization.

The manager 720 directs the flow of operations of the indexer. This manager interacts with the query manager 505, the translator 705, the input order identifier 710, and hasher 715. The manager 720 uses the translator 705 to convert each function's ROBDD representation into an intermediate integer representation. In the embodiments described below, this intermediate representation is a truth table representation, as further described below. The manager 720 uses the input-ordering identifier 710 to specify one or more orders for the input variables of the candidate sub-network selected at 210. The manager 720 then uses the hasher 715 to reduce the number of bits that represent each function's index.

Figure 8:
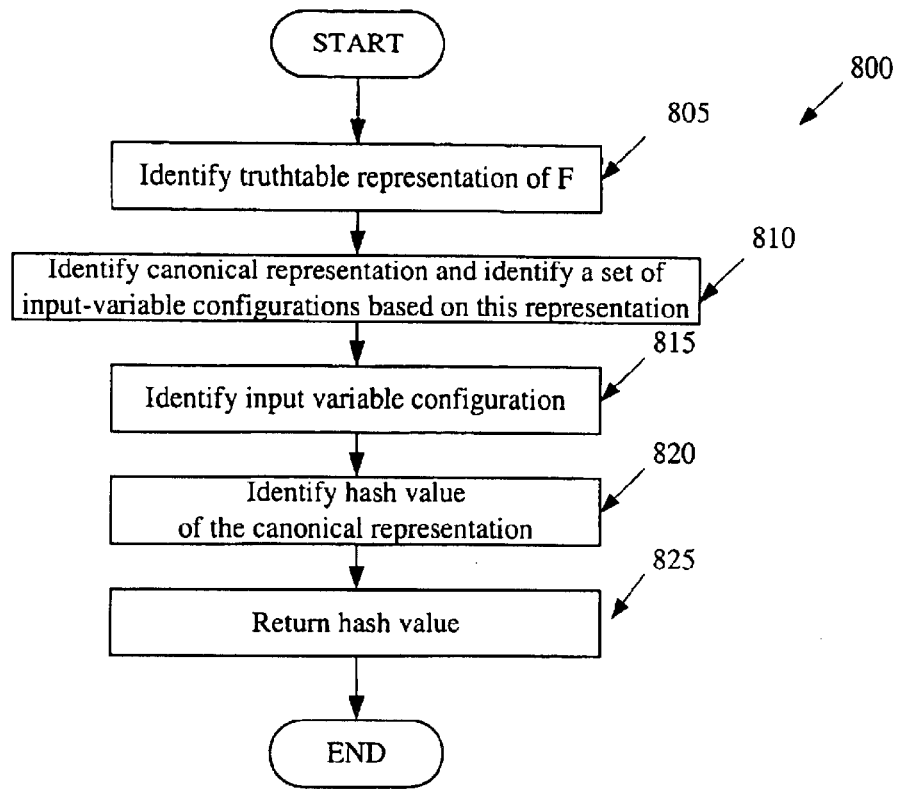
FIGS. 8 and 9 conceptually illustrate two processes that an indexer manager of the indexer of FIG. 7 performs in some embodiments of the invention.
Figure 9:
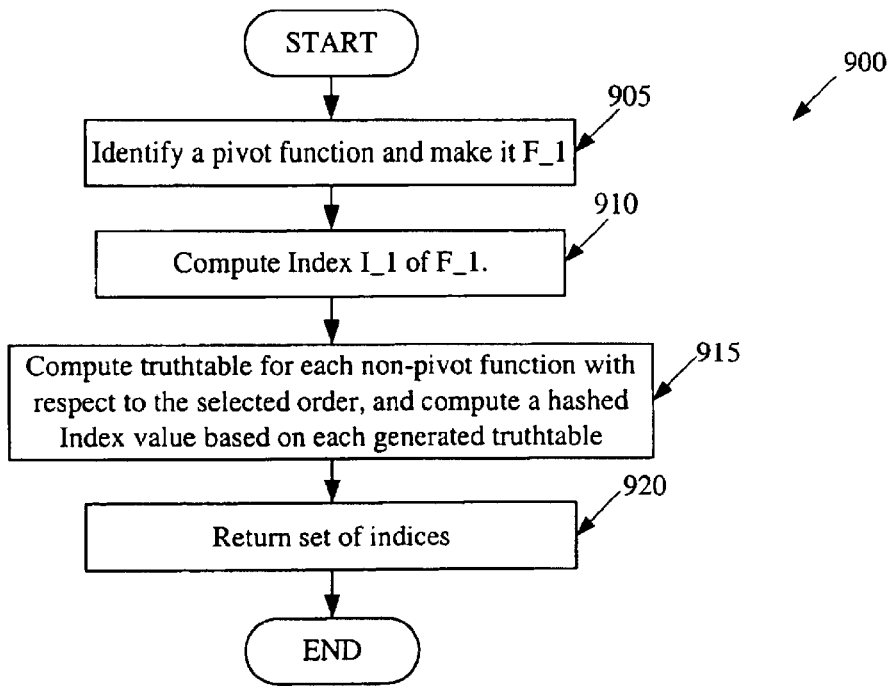

FIGS. 8 and 9 conceptually illustrate two processes that the index manager 720 performs in some embodiments. This manager uses the process 800 of FIG. 8 to identify the index for the function of a single-function query. This manager uses the process 900 of FIG. 9 to generate multiple indices for a multi-function query. Specifically, as further described below, the process 900 for a multi-function query (1) identifies one of the query functions as a pivot function, (2) uses the process 800 to identify the index for the designated pivot function and identify an input variable configuration, and then (3) identifies an index for each non-pivot function of the query based on the identified input variable configuration.

1. Computing the Index for a Single-Function Query or a Pivot Index for a Multi-function Query As mentioned above, the index manager 720 performs process 800 of FIG. 8 to identify the index for a single-function query. The manager also performs this process as part of the process 900 of FIG. 9 to identify the pivot index for a multi-function query. Whenever the process 800 is called, it is supplied with a function and an operational parameter. The operational parameter specifies whether the process 800 should select an input variable configuration randomly or deterministically. The operational parameter specifies a random operation during optimization, while it specifies a deterministic operation during pre-tabulation.

As shown in FIG. 8, the process 800 initially directs (at 805) the translator 705 to generate a truthtable representation for the function on which it is operating. As mentioned above, the query manager supplies functions in a ROBDD format to the indexer, although in other embodiments the query manager might provide the functions in another format.

The truthtable representation is a binary bit string where each bit corresponds to an output of the function for one set of input values. Table 1 below provides examples of truthtables for two functions. The first function G is a two-input AND function. As shown in the table below, the truthtable for this function is 0001. This truthtable is four bits long because there is one output bit for each set of input values. The second function H is a two-input AND that has its second input inverted. As shown in Table 1 below, the truthtable for this function H is 0100.

TABLE 1

| Input 1 | Input 2 | G | H |
|---------|---------|---|---|
| False   | False   | 0 | 0 |
| True    | False   | 0 | 1 |
| False   | True    | 0 | 0 |
| True    | True    | 1 | 0 |

If the order of inputs 1 and 2 were reversed, the truthtable for function G would remain the same, but it would change to 0010 for function H. As further discussed below, the change in the truthtable for function H reflects the fact that the truthtable representations of functions are dependent on the order of the input signals.

After generating (at 805) the truthtable of the function, the process 800 directs (at 810) the input-ordering identifier 710 to identify a canonical representation of the truthtable for the function F. A canonical representation is a fixed, unique representation, chosen from the set of possible representations, that a particular algorithm will always pick. In the embodiments described below, this canonical representation is the smallest truthtable of F from the set of truthtables for all variations of input variable ordering. For instance, the above-described function H has two input variable configurations, since it has two inputs and the order of these two inputs can be switched. The truthtables for these two input variable configurations are 0100 and 0010. Taking the least significant bit of a truthtable to be the right most bit, then the canonical truthtable representation for function H is 0010.

In some embodiments, the input ordering identifier identifies the canonical truthtable representation for the function F by having a branch-and-bound technique use the truthtable representation identified at 805 as an initial starting point to search through the space of the function's truthtables without examining all input variable configurations. One such branch-and-bound technique is described in "Boolean Matching for Large Libraries" by Uwe Hinsberger and Reiner Kolla, DAC98, Jun. 15–19, 1998.

At 810, the input-ordering identifier also specifies a set of one or more input variable configurations. Each input variable configuration in this set results in the canonical representation identified at 810. In other words, the truthtable representation of F is identical for each configuration in the specified set of input variable configurations.

One of ordinary skill will realize that other embodiments do not convert the BDD representation of the supplied function to a truthtable representation in order to perform canonicalization. These embodiments directly perform the canonicalization operation at 810 on the BDD representation of the supplied function. Jerry Burch and David Long, Efficient Boolean Function Matching, Proc. ICCAD 1992 describe obtaining semi-canonical BDD representations. The process 800 applies the canonicalization operation for the truthtable representation since this approach is fast, especially for functions with a small number of inputs, as it can be efficiently implemented by using fast machine-implemented bitwise operations.

After identifying the canonical truthtable representation and the set of input variable configurations that lead to this representation, the process 800 selects (at 815) one of the identified set of input variable configurations either deterministically or randomly based on the operational parameter that it receives. During run-time generation of indices for a candidate sub-network, the operational parameter directs the process 800 to select an input variable configuration randomly.

However, the operational parameter directs the process 800 to select an input order deterministically during pre-tabulation. The input order identifier returns (at 810) the set of input variable configurations always in a particular order. When the process 800 operates deterministically during pre-tabulation, the process 800 always selects the same input configuration in the returned set of input configurations as the input configuration. For instance, in some embodiments, this process always selects the first input configuration in the returned set as the designated configuration. The operation of the indexer 515 during pre-tabulation is further described below in Section IV.

After selecting an input variable configuration at 815, the process 800 directs (at 820) the hasher 715 to map the resulting canonical truthtable representation of the function F to an index into the network database. The truthtable representation does not serve as a good index into the database as it can be a long bitstring in many instances. Accordingly, the hasher maps the truthtable representations to hashed index values that are shorter than the truthtable representations. Section III.B.3 describes the hashers used by some embodiments of the invention. After 820, the process 800 returns (at 825) the hash value identified at 820 and then ends.

2. Computing Indices for a Multi-Function Query

FIG. 9 conceptually illustrates a process 900 that identifies the indices for a multi-function query. The index manager 720 directs this process whenever it receives a multi-function query. As shown in FIG. 9, the index manager 720 initially selects (at 905) one of the functions in the query as a pivot function. When the query has multiple pivot functions (i.e., when the candidate sub-network selected at 210 has multiple pivot functions), the index manager 720 randomly selects (at 905) one of the pivot functions in the query. In the description below, the selected pivot function is designated as the first function F_1 in order to simplify the discussion.

Index manager 720 will use the pivot function to identify an order for the input variables to the sub-networks. Accordingly, the embodiments described below select as the pivot function a function that is dependent on all the input variables, since such a pivot function could be used to impose an ordering for all input variables.

As mentioned above, the process 200's selection (at 210) of the candidate sub-network ensures that this sub-network has at least one function that is dependent on all the input variables. Also, in the embodiments described below, the sub-network pre-tabulation comports with such a selection of the pivot function, since the pre-tabulation process pre-tabulates only multi-function sub-networks that have at least one pivot function.

In other embodiments, the selection of the candidate sub-network at 210 and/or the pre-tabulation of the sub-networks do not need to ensure the existence of at least one pivot function (i.e., of an output function that is dependent on all input variables). For instance, the process 900 could deal with candidate sub-networks that do not have an output function dependent on all input variables, by terminating its search for replacement sub-networks. Alternatively, the process 900 could deal with multi-function queries that do not have pivot functions by selecting (at 905) a function that is dependent on the most number of inputs and then using a particular scheme to specify the position of the other sub-network inputs. For instance, if the selected candidate sub-network has five inputs, and its best output function depends on only 4 inputs, the process 900 might select the best output function and position the fifth input as the leftmost input. Accordingly, the existence of the pivot function is not crucial, but rather is employed by the embodiments described below in order to improve the hit rate of the optimizer.

After 905, the process 900 computes (at 910) the index I_1 for the selected pivot function F_1. The index manager uses process 800 of FIG. 8 to compute this index value I_1. As described above, the canonicalization procedure at 810 returns the canonical truthtable representation of the function F_1 plus an input ordering. The returned input variable order is used to generate the indices for the remaining non-pivot functions in the query.

Specifically, for each particular non-pivot function, the index manager uses (at 915) the translator 705 to generate the truthtable representation for the non-pivot function, based on the input variable ordering returned at 910. At 915, the index manager also uses the hasher 715 to generate an index for each non-pivot function from the function's generated truthtable representation. At 920, the index manager 720 then returns the generated set of indices to the query manager 505.

In sum, the indexing scheme used by the indexer is as follows in some embodiments of the invention. The indexer converts a single-function query into a single index into the network database, and this single-index identifies a set of one or more sub-networks that realize the function of the query.

For a multi-function query, this indexer selects one of the functions as a pivot function, specifies an input variable order based on this pivot function, and generates an index for this pivot function. Based on the specified order, it then generates an index for each of the non-pivot functions of the query.

As described below, the pre-tabulation process associates each particular combinational-logic function with exactly one pivot index, which is used whenever the particular function serves as pivot for a certain query. Each function's pivot index (also called primary index) is the index that indexer generates during pre-tabulation by using a process similar to the process 800 except that during pre-tabulation the index generation process deterministically selects one of the input variable configurations as opposed to the random selection at 815. In addition, during pre-tabulation, each combinational-logic function is associated with a number of secondary indices. Secondary indices of a function F are used to number (or identify) the cases when a query is made for some set $\{G, \ldots, F, \ldots\}$ where a different function G serves as pivot function and therefore determines the input ordering.

3. Hasher

In some embodiments, the hasher 715 uses a hashing function that is described in "An Optimal Algorithm for Generating Minimal Perfect Hashing Functions," by Zbigniew J. Czech, et al., Information Processing Letters, 43(5); 257–264, October 1992 ("Czech's paper"). This hashing function is referred to as the "minimal" hashing function. Czech's paper describes in detail how to generate this hashing function.

In the current context, the minimal hashing function is generated during the pre-tabulation of the sub-networks. Specifically, during pre-tabulation, the data generator generates numerous sub-networks. For each sub-network, the data generator has the indexer compute the canonical truthtable representation of each pivot function of the sub-network. When the sub-network performs more than one function, the indexer also specifies an input variable configuration based on the canonical truthtable representation, and generates a truthtable representation for each non-pivot function of the sub-network. Based on the computed truthtable representations, the data generator uses a hashing function creator (not shown) to associate each of the pre-computed truthtable representations with a unique-index value and generates a hashing function that realizes this association. The creation of the minimal hashing function from a defined (static) hash table is described in detail in Czech's paper. During optimization, the hasher uses the generated hashing function to generate an index for each truthtable that the hasher receives from the index manager 720.

This minimal hashing function has the advantage that it takes only a small amount of memory while still performing a single evaluation of the hashing function in linear time dependent on the size of the truthtable that is input to the hashing function. However, the tradeoff is that this function has the property that it will always return a value for any truthtable representation. For a truthtable that is equal to one of the precomputed tables, the hashing function returns always its unique index value. For any other input this function returns also some integer but it is difficult to check whether the returned value is a valid value for a valid input or just an arbitrary output for an invalid input. Consequently, because of this hashing function, the query manager has to determine at 630 whether a retrieved replacement sub-network performs the set of output functions of the selected candidate sub-network.

Other embodiments might use other hashing approaches. For instance, some embodiments might use more traditional hashing techniques, such as those described in Cormen, Leiserson, Rivest, and Stein, "Introduction to algorithms," Second edition, MIT Press, 2001, Chapter 11. Traditional hashing approaches specify values for only valid keys (i.e., for only valid truthtable representations). For instance, some traditional hashers support the query "retrieve a value stored in hash table for a particular key" and the query "is anything for a particular key stored in the hash table." Other traditional hashers return some dedicated NULL value for any query of type "retrieve value stored in hash table for some key" when no element is stored for the key.

Traditional hashers have the advantage that they can detect that there is no hashed value for a particular truthtable. Accordingly, in such circumstances, the indexer would not return indices for functions that do not have an associated hashed value and instead would notify the query manager that there is no associated index for the particular function. Because of this, the query manager would not retrieve irrelevant sub-networks from the database and, therefore, would not need to perform the matching determination at 630. On the other hand, a traditional hashing approach requires the storage of all valid keys within the hash-table. This, in turn, would require the storage of all lengthy truthtable representations, which would require a large amount of memory.

4. Input Variable Correction by the Query Manager

As mentioned above, the query manager determines (at 630) whether a retrieved replacement sub-network matches the candidate sub-network selected at 210. The replacement sub-network matches the candidate sub-network only if the replacement sub-network performs all the output functions of the candidate sub-network (i.e., all the functions in the set of functions F identified at 215 for the candidate sub-network) for a particular input variable configuration of the replacement sub-network.

FIGS. 10–13 illustrate an example of such a matching determination. FIG. 10 illustrates a candidate sub-network 1005 from a network 1000. The candidate sub-network includes two AND gates 1010 and 1015, and a NAND gate 1020. The candidate sub-network receives inputs x_0, x_1, and x_2 in the order illustrated in FIG. 10. When the output functions are specified by a BDD package (such as BuDDy described above), the input variables have a natural ordering as they are just integer indices provided by the BDD package.

In the example illustrated in FIG. 10, the candidate sub-network 1005 has only one output function F. Based on this output function, the indexer generates an index, and the table manager retrieves a replacement sub-network. FIG. 11 illustrates the circuit schematic for such a replacement sub-network after it has been decoded. (This schematic is only for explanatory purposes since after the replacement sub-network is decoded at 625, the sub-network is represented by a graph and a local function for each node in the graph.)

As shown in FIG. 11, the replacement sub-network 1105 has two gates and three inputs I_0, I_1, and I_2. One gate is a two-input AND gate 1110 with an inverted input The other gate is a two-input AND gate 1115. The inputs have a generic ordering. Specifically, when the replacement sub-network is decoded, it is a graph made of a linked node list. If the replacement sub-network has n inputs then the decoded network structure has a "dummy" node 1120 for each input. Internal nodes that are fed by one of these network inputs have a directed arc from the network input to one of their node inputs. The dummy nodes are stored in an array so they have a generic ordering just by array index.

The matching operation at 630 tries to identify an input configuration for the replacement sub-network 1105 so that this sub-network's set of output functions includes the output function of the candidate sub-network selected at 210. In other words, the matching operation tries to identify a reordering of the array of "dummy" nodes and a correlation of each dummy node's input with one of the input variables (x_0 to x_2) that enables the replacement sub-network to perform the output function set of the candidate sub-network 1005.

Figure 13:
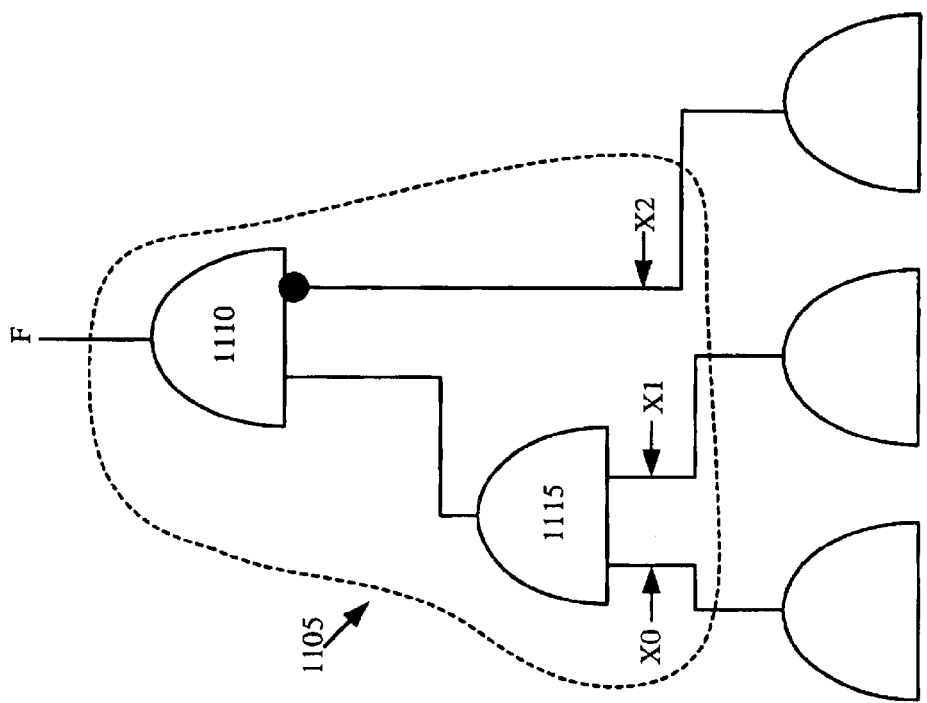
Figure 12:
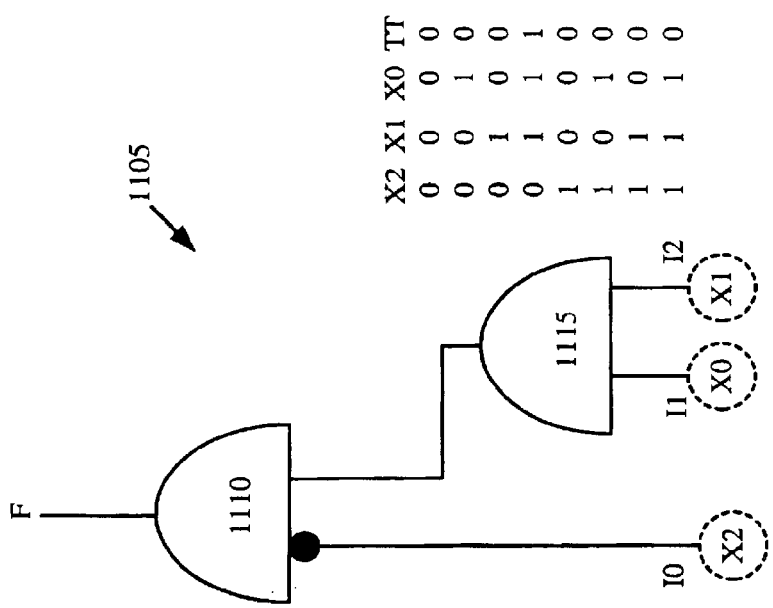

As shown in FIG. 11, because of its input configuration, the output function of the replacement sub-network 1105 has a different truthtable from the output function F of the candidate sub-network 1005. FIG. 12, however, illustrates an input configuration for the replacement sub-network 1105 that produces the same output function (i.e., has the same output truthtable) as the candidate sub-network's output function F. FIG. 13 illustrates how the configuration illustrated in FIG. 12 can be inserted in the network 1000.

Figure 14:
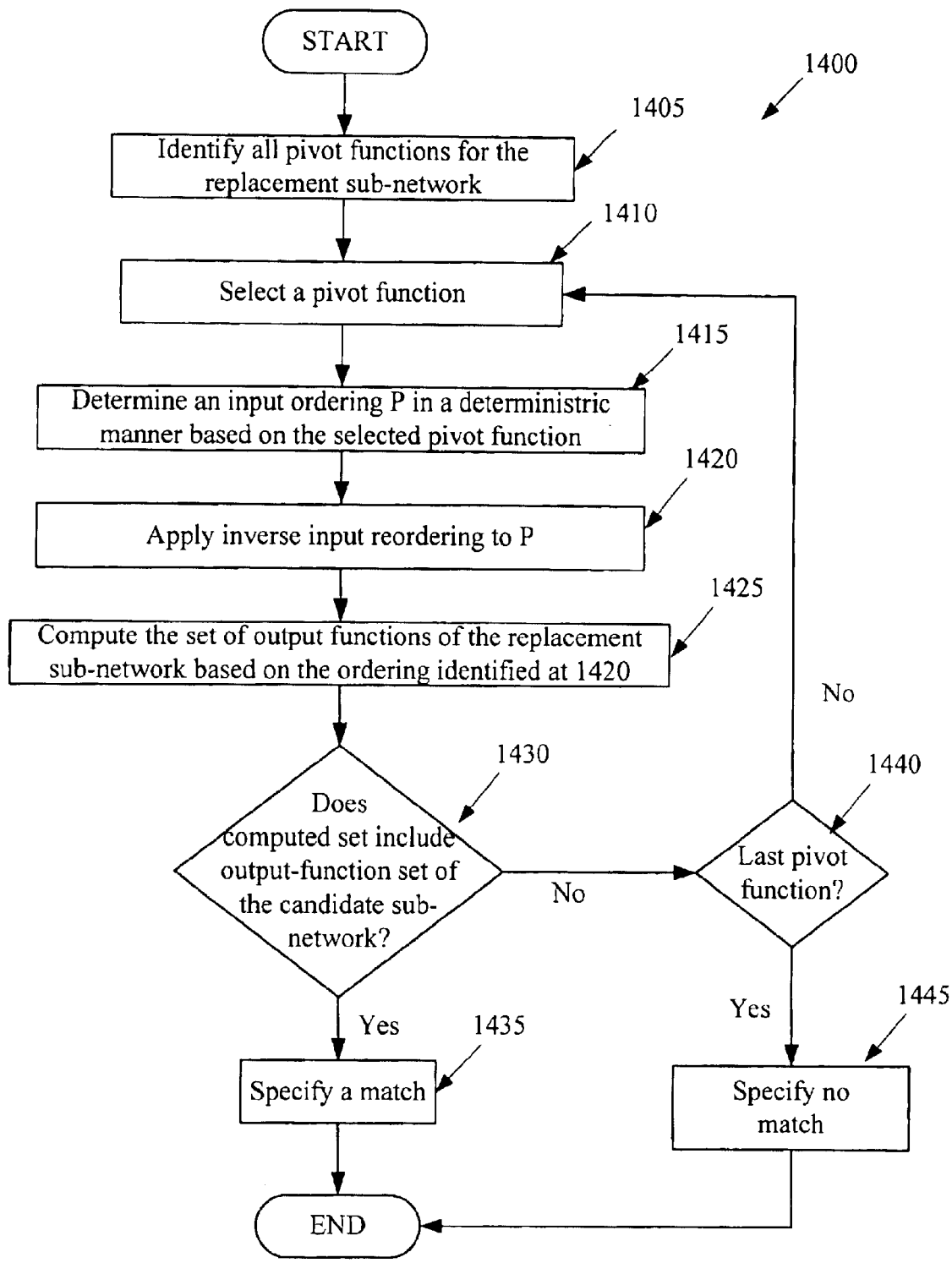
FIG. 14 illustrates a process that the query manager performs to determine whether a replacement sub-network matches a candidate sub-network.

FIG. 14 illustrates a process that the query manager 505 performs at 630 to determine whether a replacement sub-network matches the candidate sub-network selected at 210. As shown in this figure, the process 1400 initially identifies (at 1405) all pivot functions of the replacement sub-network. In other words, it identifies all pivot functions in the replacement sub-network's function set G {G_0, . . . , G_n}, where each function is computed with respect to the input ordering after the decoding of the sub-network at 625.

The process then selects (at 1410) one of the identified pivot functions. For the selected pivot function, the query manager has the indexer compute a set of indices deterministically (i.e., performing an index-generation operation that always produces the same set of indices for the same pivot function and the same set of non-pivot functions).

To perform this deterministic operation, the process 1400 initially has the indexer deterministically identify (at 1415) an input variable configuration P that leads to the canonical truthtable representation of the pivot function. To identify such a configuration, the index manager 720 (1) has the translator 705 generate a truthtable representation of the pivot function, and then (2) has the input order identifier identify a set of input configurations that lead to the smallest-valued truthtable representation of the pivot function. The input order identifier always returns the set of input variable configurations in a particular order. The index manager always selects the same input configuration in the returned set of input configurations as the input configuration P identified at 1415. For instance, in some embodiments, the index manager always selects the first input configuration in the returned set as the designated configuration P.

This deterministic operation of the indexer during runtime optimization works in conjunction with its deterministic operation during the database generation, as further described below. Also, this deterministic operation during input-configuration matching is different from the above-described randomized operation of the process 800 during the generation of a set of indices for a set of functions of the candidate sub-network selected at 210. In its randomized operation, the process 800 randomly selects (at 815) an input variable configuration from the set of viable input configurations for a particular function.

After deterministically identifying (at 1415) an input variable configuration P, the process 1400 readjusts the identified input configuration based on the configuration used at 605 to generate the set of indices for the candidate sub-network selected at 210. For instance, assume that the set of output functions of the candidate sub-network had an initial configuration R, and that the indexer selected (at 815) an input configuration R' that produced the canonical representation of a particular function. If an operation Q has to be performed on R to obtain R', then the process 1400 obtains (at 1420) a new configuration by applying the inverse of the operation Q to the input configuration P identified at 1415 (i.e., apply $Q^{-1}(P)$).

The process 1400 then identifies (at 1425) the set of functions H performed by the replacement sub-network based on the input ordering identified at 1420. In some embodiments, the process specifies (at 1425) each function in terms of its ROBDD. Also, in some embodiments, the identified set of output functions includes an output for each node of the replacement sub-network. The output function at a particular node's output is the particular node's local function when the particular node does not receive the output of any other node in the replacement network graph. Alternatively, when the particular node receives the output of another node or other nodes in the replacement sub-network, an output function at the particular node's output can be derived from the particular node's local function and the local function of each node whose output the particular node receives.

After 1425, the process then determines (at 1430) whether the set of functions H identified at 1425 includes the set of functions F that were identified for the candidate sub-network at 215. If so, the replacement sub-network matches the candidate sub-network for the input configuration specified at 1425. Accordingly, the process 1400 specifies (at 1435) a match and the input configuration resulting in this match and then ends.

On the other hand, if the process determines (at 1430) that the set of functions H identified at 1425 does not include the candidate sub-network's set of functions F, the process determines (at 1440) whether it has examined all the pivot functions identified (at 1405) for the replacement sub-network. If not, the process transitions back to 1410 to select another pivot function, and performs the subsequent operations for this function. Otherwise, the process 1400 specifies (at 1445) that the replacement sub-network does not match the candidate sub-network and then ends.

C. Database Tables and Table Manager

Once the indexer 515 returns a set of indices to the query manager, the query manager directs the table manager 520 to retrieve all sub-networks that are associated with the returned set of indices. In response, the table manager searches the database 525 and returns a set of sub-networks. This set is an empty set when the database 525 does not store any sub-network that is associated with the received set of indices. When the set of identified sub-networks is not empty, the sub-networks in this set are in an encoded form, and the table manager returns these sub-networks in this form to the query manager.

1. Database Tables

Figure 15:
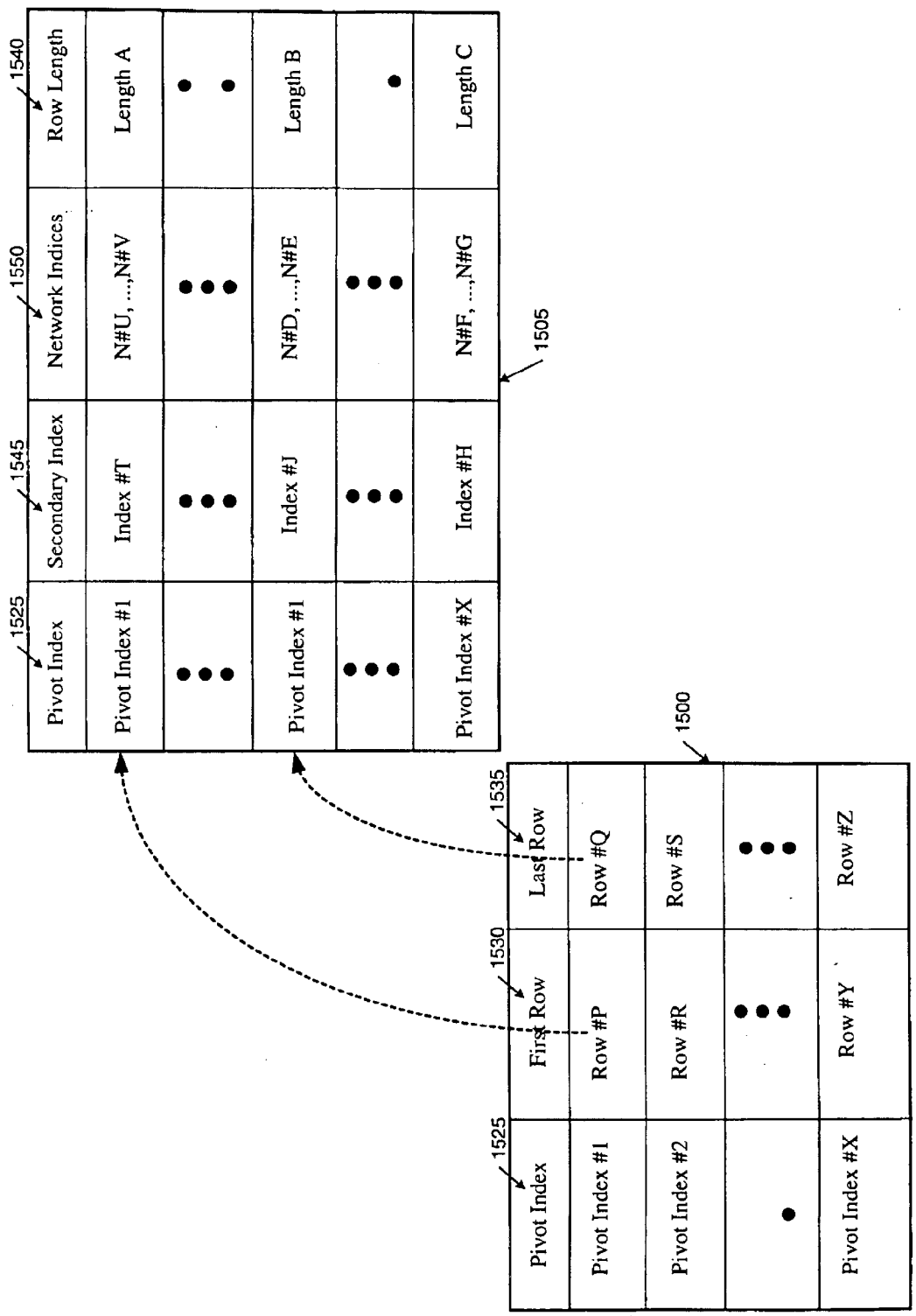
FIGS. 15 and 16 illustrate several database tables that are used in some embodiments.
Figure 16:
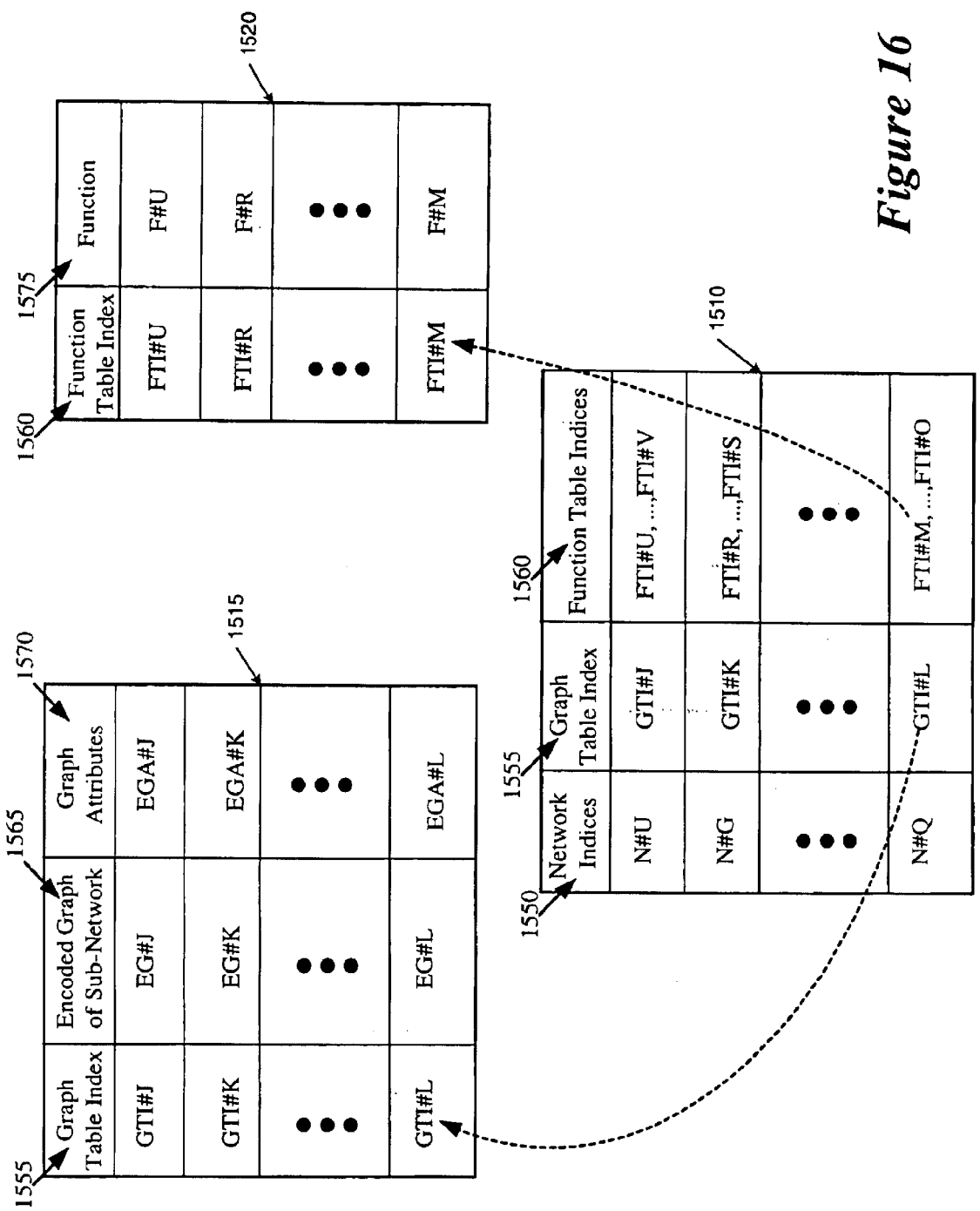

In the embodiments described below, the database 525 is a relational database, and the table manager 520 is the querying engine of this database. FIGS. 15 and 16 conceptually illustrate the database schema used by the database 525. One of ordinary skill will realize that these figures simply conceptually illustrate the database design for some embodiments of the invention, and that other embodiments of the invention might use other database designs.

FIGS. 15 and 16 illustrate five database tables. These tables include (1) the pivot table 1500 and secondary table 1505, which are illustrated in FIG. 15, and (2) the sub-network table 1510, the graph table 1515, and the function table 1520, which are illustrated in FIG. 16.

As shown in FIG. 15, the pivot table 1505 includes a row for each pivot index 1525, while the secondary table includes a set of one or more rows for each pivot index 1525. In addition, each particular pivot table row in the pivot table specifies first row 1530 and last row 1535 in the secondary table 1505 for the pivot index of the particular pivot-table row. During pre-tabulation, all the rows in secondary table 1505 that are related to the same pivot index are arranged next to each other in a particular order (e.g., sorted by increasing secondary index stored in each secondary table row). Accordingly, a particular pivot table row needs to describe only an interval of rows within the secondary table (i.e., needs to identify only first and last secondary table rows) rather than enumerating all rows explicitly.

The rows of the secondary table 1505 have variable lengths. Hence, each row includes a field 1540 that specifies the row's length. In addition, each row of the secondary table 1505 has a field 1545 for specifying a particular secondary index associated with a particular pivot index. A secondary table row might store a null value in its secondary index field, as further described below.

The secondary table 1505 also expresses the relation between pre-tabulated sub-networks and the pivot and secondary indices. Specifically, each particular secondary table row has a set of fields 1550 that specify a set of one or more network indices for each pair of pivot and secondary indices that the particular secondary table row stores. The set of network indices within a single row are sorted in a particular order (e.g., by increasing network indices) during pre-tabulation. Each set of network indices can include one or more indices.

After identifying a range of rows for the pivot index of a set of database indices I received from the query manager, the table manager tries to identify a secondary table row in the identified range for each secondary index in the received set of database indices. If the table manager is successful, each network index that is stored in all the identified secondary table rows specifies a potentially matching sub-network that the table manager should return to the query manager.

Each network index that is stored in a secondary table row specifies a row in the network table 1510, which is illustrated in FIG. 16. Each row in the network table 1510 corresponds to a particular sub-network. In the embodiments described below, each sub-network is specified by (1) a graph having one or more nodes, and (2) a set of functions that includes a local function for each node of the graph. Accordingly, each row in the network table specifies a graph-table index 1555 and a set of function-table indices 1560.

A graph-table index 1555 identifies a graph-table row that stores the encoded graph 1565 for the sub-network associated with a network index of the network table row. As further described below in Section III.D, each encoded graph 1565 specifies in an encoded manner (1) one or more nodes of the sub-network, and (2) the connections between these nodes. Also, FIG. 16 illustrates each graph-table row in the graph table 1515 to include a set of fields 1570 that store additional attributes of the graph stored in that row. Examples of such attributes include the actual or estimated size or speed of the sub-network represented by the graph. Typically, such attributes can be derived from the structure of the graph, but they can be stored in the database to speed up the operation of the optimizer.

The function table 1520 stores the local functions 1575 of the graph nodes. In some embodiments, the functions are stored in an ROBDD format in the function table. The function table is indexed by the function table indices 1560 that are stored in this table and in the network table 1510. More specifically, each function-table index 1560 in a network table row corresponds to a particular node of a graph 1565 that is indexed in the graph table 1515 by the network table row's graph-table index. A network table row stores its function-table indices in a particular manner that corresponds to the ordering of the nodes. For example, for a multi-function set, the first function index corresponds to the first-node's function, the second function index corresponds to the second-node's function, etc. For its corresponding graph node, a function-table index specifies a function 1575 in the function table.

Although FIG. 16 illustrates only one function table, other embodiments use multiple function tables. For instance, some embodiments might have one function table for all two-input functions, one function table for all three-input functions, one function table for all four-input functions, and one function table for five or more input functions. For a particular function index of a particular node, the table manager in some of these embodiments identifies the particular node's number of inputs and then uses the particular function index to identify the function in the function table for the identified number of inputs.

The schema described above allows fast search for matching networks. In other words, no table needs to be fully scanned. Instead, this schema provides direct access to pivot rows, a binary search for secondary rows, a linear scan for the computation of the intersection of the secondary rows, and direct access to the functions, graphs, and networks stored in the function table, graph table, and network table.

2. Table Manager

Given a set of database indices I, which may include one or more indices I_1, . . . , I_n, the table manager has to return a graph and a set of functions for each sub-network SNW, where (1) each sub-network SNW is related to the pivot index of the received set, and (2) the sub-network SNW and the pivot index are related to all secondary indices in the received set. In other words, the table manager has to return all sub-networks that are associated with the pivot index and all secondary indices of the received database-index set.

This task is a standard function that is supported by any relational database management system, such as those offered by Oracle Corp. or Informix, Inc. Therefore, the table manager can be directly realized with any commercial or non-commercially available relational database system.

Figure 17B:
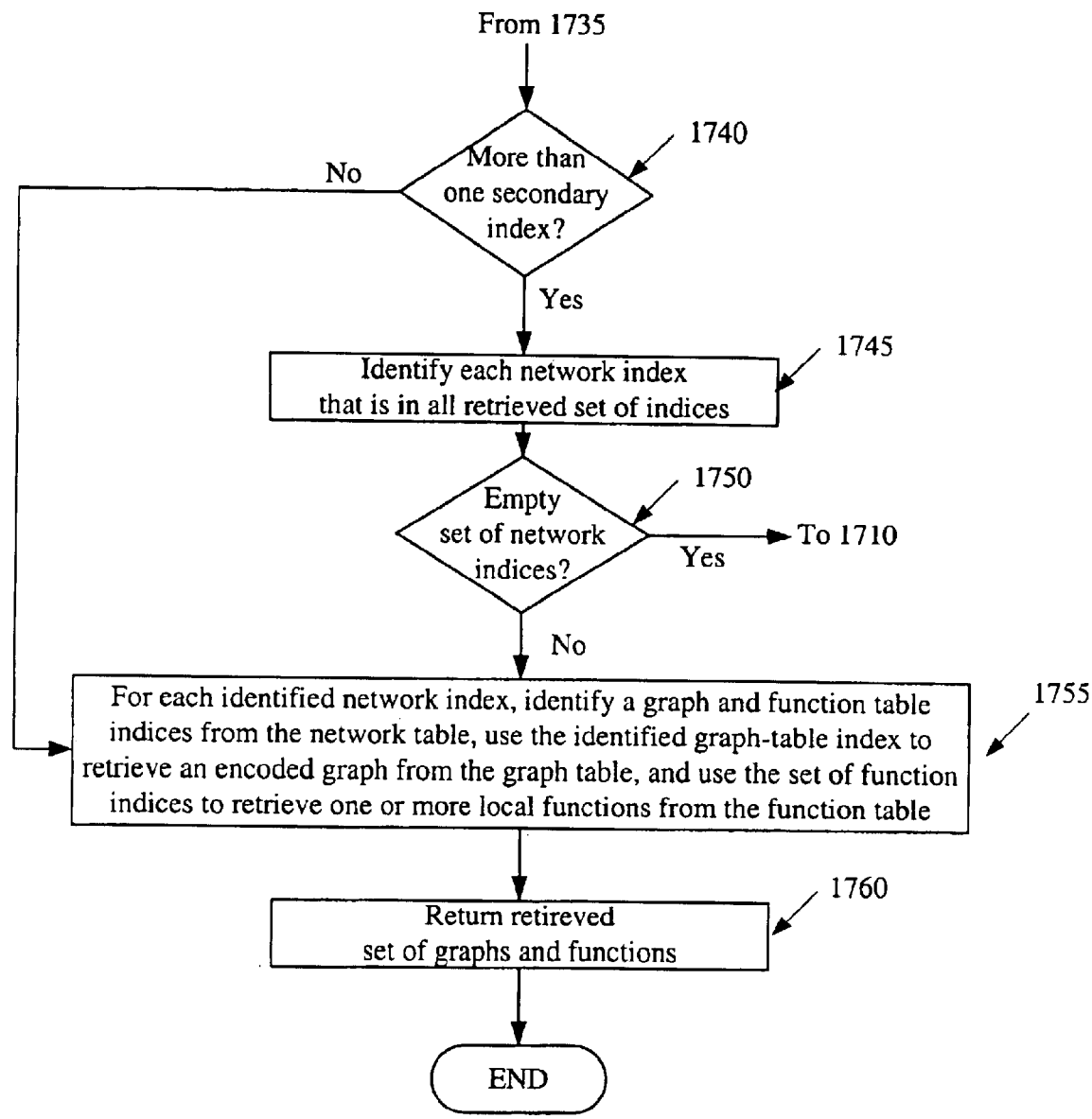
FIG. 17 conceptually illustrates a process that some embodiments use to retrieve pre-tabulated sub-networks from a database.

FIG. 17 conceptually illustrates a process 1700 that the table manager 520 uses in some embodiments to retrieve pre-tabulated sub-networks (i.e., pre-tabulated encoded graphs and functions) from the database 525. The table manager performs this process each time it receives a set of database indices I, which might include one index or several indices.

As shown in FIG. 17, the table manager initially determines (at 1705) whether the pivot table has a row for the pivot index of the received set of database indices. If not, the table manager informs (at 1710) the query manager that there is no matching sub-network (i.e., the database does not store a sub-network that is related with all the indices of the query) and then ends.

Otherwise, the process accesses (at 1715) the row in the pivot table 1500 that is for the pivot index of the received set of database indices. When the received database-index set includes only one index, this set's pivot index is its one and only index. On the other hand, the pivot index of a multi-index set is the index that the process 900 specified at 905 and 910.

The table manager accesses the pivot-table row of the set's pivot index in order to identify a range of rows in the secondary table 1505. This range of rows specifies all the secondary indices that might be associated with the pivot index of the received database-index set. The table manager can search the pivot table 1500 in constant time since the pivot table is sorted such that its row numbers are equal to the "Pivot_Index" of this row.

At 1720, the table manager selects a secondary index in the received database-index set. It then determines (at 1725) whether a row in the identified range has a secondary index that matches the selected secondary index. If not, the table manager then informs (at 1710) the query manager that there is no matching sub-network and then ends.

On the other hand, if the process identifies (at 1725) a row in the identified range that has a secondary index that matches the selected secondary index, it retrieves (at 1730) the set of network indices from the selected row. Because the rows within the secondary table are sorted by secondary indices, the table manager's search of this table can be done efficiently as a binary search. Also, when the received database-index set includes only one index, a secondary table row matches the received database-index set if it specifies the received set's pivot index and a null for the secondary index.

Next, at 1735, the process determines whether it has searched for all secondary indices in the received database-index set. If not, the process transitions back to 1720 to select another secondary index in this set. Otherwise, the process determines (at 1740) whether the received database index set includes more than one secondary index. If not, the process transitions to 1755, which is described below.

However, if the received database index set includes more than one secondary index, the process cross compares (at 1745) all the sets of network indices retrieved at 1730 to identify each network index that is in all sets of network indices retrieved at 1730. The table manager can perform this cross-comparison in linear time (i.e., in an amount of time that scales linearly with the number of network indices) because the network indices are sorted in a particular order.

Next, the process determines (at 1750) whether this cross-comparison leads to an empty set. If so, the table manager then informs (at 1710) the query manager that there is no matching sub-network and then ends. Otherwise, the process transitions to 1755. For each network index that the process identifies at 1745 to be in all the sets of network indices retrieved at 1730, the process (at 1755) identifies graph- and function-table indices from the network table. As mentioned above, each network index specifies a graph-table index and a set of function-table indices. At 1755, the process (1) uses each identified graph-index to retrieve an encoded graph from the graph table, and (2) uses the set of function indices associated with the identified graph-index to retrieve a set of functions for the nodes of the retrieved graph. The table manager then returns (at 1760) the retrieved sets of graphs and functions to the query manager.

D. Sub-Network Encoding and Decoding

Once the table manager returns a set of graphs and functions to the query manager, the query manager determines (at 615) whether the table manager returned any sub-network. If so, the query manager selects (at 620) one of the returned sub-networks and directs (at 625) the network encoder 510 to decode the selected sub-network.

In order to store a large number of sub-networks in a database, some embodiments use a compact encoding of the sub-networks. The embodiments described below use an encoding scheme that has three levels of encoding.

1. Graph and Function Tables

The first level of encoding (which was described above by reference to FIG. 16) specifies each sub-network by (1) a graph having one or more nodes, and (2) a set of functions that includes one local function for each node of the graph. This manner of specifying sub-networks exploits similarities between different sub-networks.

Specifically, each sub-network can be described by its structure and by the set of functions performed by its node or nodes. Different sub-networks might have similar structures or might have nodes that perform similar functions. Consequently, the encoding scheme (1) stores the structural and functional attributes separately, and then (2) describes each sub-network by reference to the stored structural and functional properties.

In the embodiments described below, the structure of each sub-network is described in terms of a directed acyclic graph. The nodes of such a graph represent the circuit elements of the sub-network, and the directed edges correspond to the connection between the sub-network's circuit elements.

Because of the offline computation of the database, all graphs that occur as network structures within the database are known in advance. Moreover, many of these graphs are isomorphic, i.e., they are identical with respect to a certain numbering of the nodes. In fact, the number of distinct non-isomorphic graphs is very small compared to the total number of sub-networks in the database.

Accordingly, in some embodiments, the graph table 1515 illustrated in FIG. 16 stores all non-isomorphic graphs up to a certain size. Section IV below describes techniques for generating a table of all smaller non-isomorphic graphs up to a certain size. Each generated graph structure is stored as an entry in the graph table 1515. In some embodiments, entries in this table are numbered (indexed) sequentially from 0, . . . , n.

Also, in some embodiments, the function table 1520 stores all local functions that can occur in any of the pre-computed sub-networks. As all possible local functions are known beforehand, and their number tends to be small, such a table can be easily generated during the pre-tabulation process.

For a database that is bounded to a specific technology library, the local functions are taken from the specific technology library (i.e., they correspond to all logic functions that can be computed by a single circuit element in the library). Some technology libraries contain fewer than 256 different logic functions that can be implemented by a single block. Therefore, for such a library, an index 1560 into table 1520 can be implemented as a single byte. A further reduction can be achieved by using several function tables to store combinational-logic functions with the same number of inputs separately, as described above.

For a database that is not bound to a specific technology library, the function table can include local functions from one or more technology libraries and/or additional abstract functions that are not from any particular technology library. Adding additional functions to the function table increases the size of the database (i.e., increases the number of sub-networks specified in the database). However, some efficiency can be realized by using several function tables to store the functions according to their number of inputs.

2. Encoding Each Graph

The second level of encoding relates to the encoding of the graph structures. When the number of graphs is relatively small (e.g., 10000–50000), any reasonably sparse compression encoding of the graph structures can be used. Some embodiments use the following schema:

Graph_Encoding={Node_1_Encoding} . . . {Node_N_Encoding}, where

Node_J_Encoding={Node_Identifier} {Edge_1_Encoding} . . . {Edge_M_Encoding}, where Edge_I_Encoding={Edge_Identifier} {Node_X_Index}.

In other words, this schema defines each encoded graph in terms of one or more encoded nodes (i.e., in terms of one of more Node_J_Encoding's). Each encoded node is defined in terms of an identifier (Node_Identifier) and one or more encoded edges (i.e., one of more Edge_I_Encoding's). The Node_Identifier specifies the start of the description of an encoded node. Also, each encoded edge for a node specifies an incoming edge to the node.

Each encoded edge is defined in terms of an identifier (Edge_Identifier) and a node index (Node_X_Index). The Edge_Identifier specifies the start of the description of an encoded edge, while the node index identifies the graph node from which the edge is coming. One of ordinary skill will realize that other embodiments might use a schema that specifies outgoing edges of nodes as opposed to incoming edges. Only incoming or outgoing edges need to be defined for each encoded node because the graph is a directed one.

A more specific version of the schema described above stores each graph nodewise according to a certain numbering of the nodes from 0, . . . , n−1. This schema encodes each graph as a bitstring. In this bit string, this schema uses a single "1" bit as the common node identifier (Node_Identifier) for each node in the graph, and a single "0" bit as the common edge identifier (Edge_Identifier) for each edge of each node. Also, the node index for each edge is an integer that corresponds to the number assigned to the starting node for the edge.

Some embodiments store only sub-networks with fewer than 16 nodes/network in the database. In these embodiments, it is possible to encode the index of a starting node of an edge with 4 bits. Therefore, the maximum number of bits that this scheme uses is provided by the equation below:

Maximum number of bits=#nodes+#edges*(1+4).

A further reduction is achieved based on the following observation. Some embodiments require combinational-logic sub-networks to be acyclic, i.e., require certain ordering of the nodes such that any node "i" only has ingoing edges from nodes "j", where "j"<"i". In other words, this denotes that the input of a certain node must not depend on the output of this node. Computing such an ordering of the nodes requires linear time only. From such an ordering, it follows that the starting node of an edge incident on node "i" is within the range of 0, . . . , i−1. Accordingly, the node index of each starting node can be encoded (1) with 1 bit for nodes 0, . . . , 2, (2) with 2 bit for nodes 3, . . . , 4, (3) with 3 bits for nodes 5, . . . , 8 and (4) 4 bits for nodes 9, . . . , 15. For graphs with at most 8 nodes, this results in a further reduction by at least one bit/edge.

Figure 19:
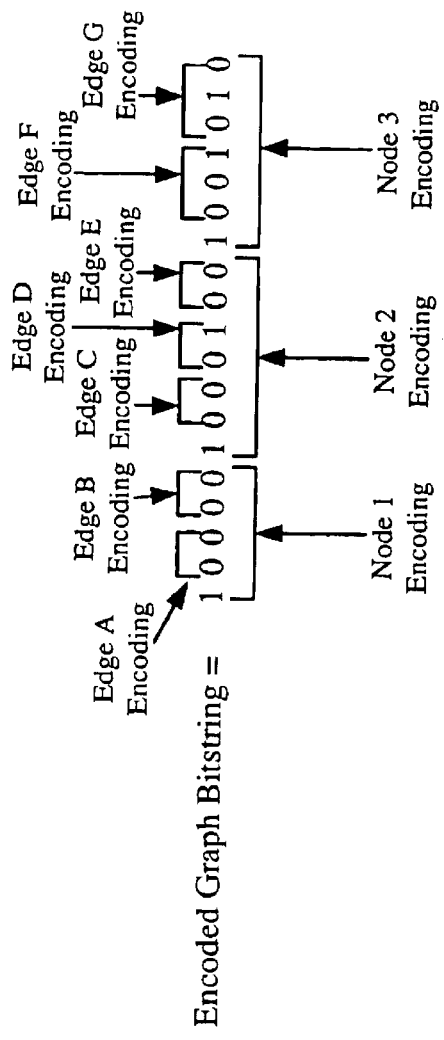
FIGS. 18–20 illustrate an example of a graph encoding scheme that is used in some embodiments of the invention.
Figure 20:
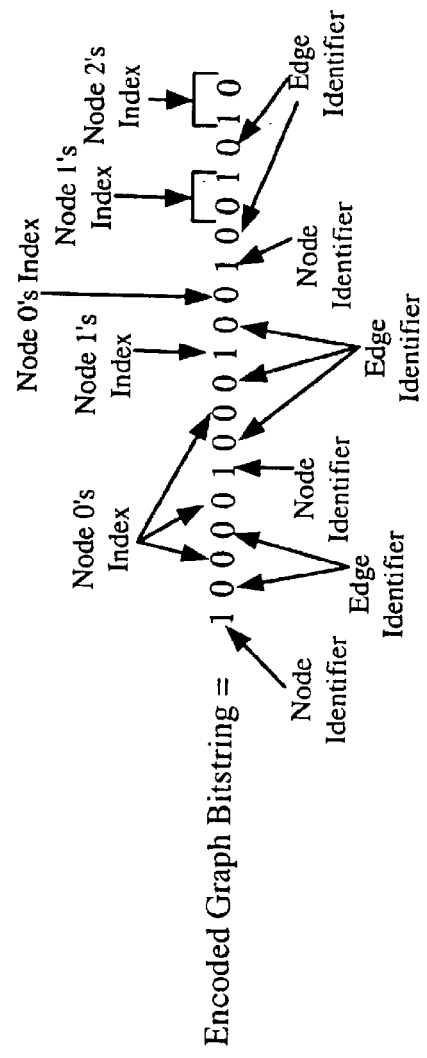
Figure 18:
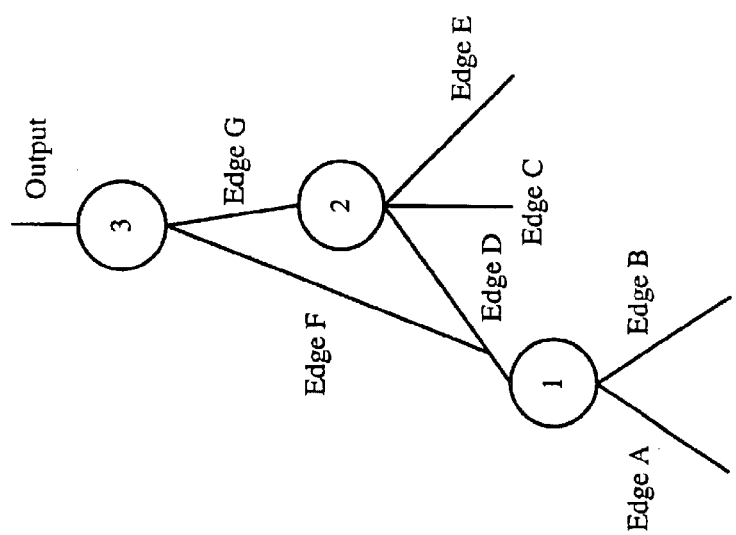

FIGS. 18–20 illustrate an example of the graph encoding scheme described above. FIG. 18 illustrates a graph of a sub-network. This graph includes three nodes and seven edges. Also, in this graph, the three nodes are defined as nodes 1, 2, and 3. Node 0 defines an "abstract" set of nodes from which the inputs to the sub-network originate. FIGS. 19 and 20 illustrate a bitstring that represents the graph of FIG. 18 in an encoded fashion.

This graph encoding yields highly compressed structural descriptions of sub-networks. For instance, if all networks have at most 8 nodes and on average 12 edges, then the average size of a graph encoding is bound by 56 bits (i.e., 8+12×4). For a database with several million networks, empirically fewer than 65536 different graphs are needed, so that the total size of table 1515 is bound by 3670016 bits (i.e., 56 bits*65536 graphs), which is about 450 kbyte.

One of ordinary skill will realize that other embodiments might use other encoding schemes. For instance, some embodiments might use Huffman encoding or arithmetic encoding to encode the structure of each graph.

IV. Data Generator

Figure 21:
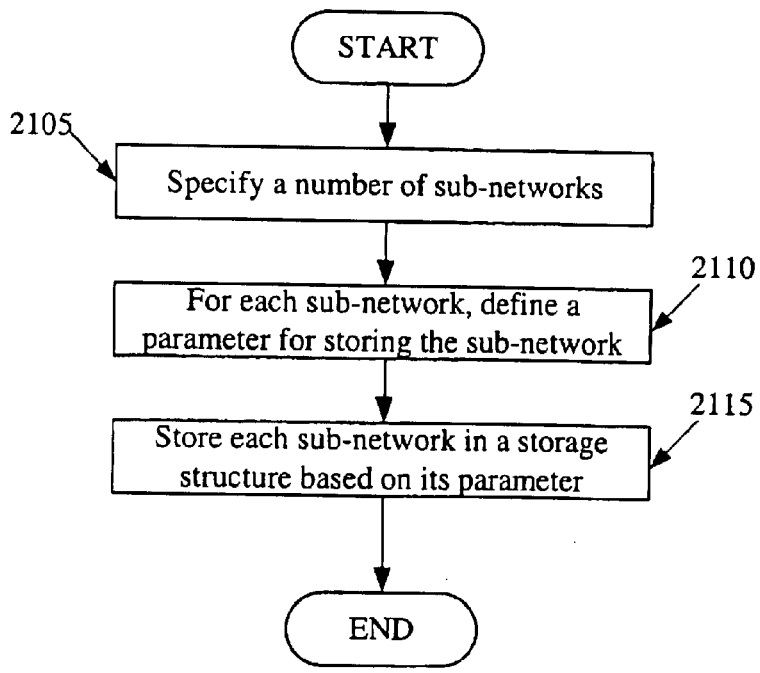
FIG. 21 presents a process that conceptually illustrates several operations performed by a data generator in some embodiments of the invention.

FIG. 21 presents a process 2100 that conceptually illustrates several operations performed by the data generator 115 in some embodiments of the invention. As shown in this figure, the data generator specifies (at 2105) numerous sub-networks. These sub-networks might include multi-element sub-networks and/or multi-output sub-networks. For each specified sub-network, the data generator defines (at 2110) a parameter for storing the sub-network. Based on each sub-network's defined parameter, the data generator stores the sub-network in a storage structure 105.

As discussed above, some embodiments use a database as the storage structure, and use indices into this database as the parameters for storing the sub-networks. One of ordinary skill will realize that other embodiments might use different storage structures (e.g., data files) and/or different storage parameters.

Figure 22A:
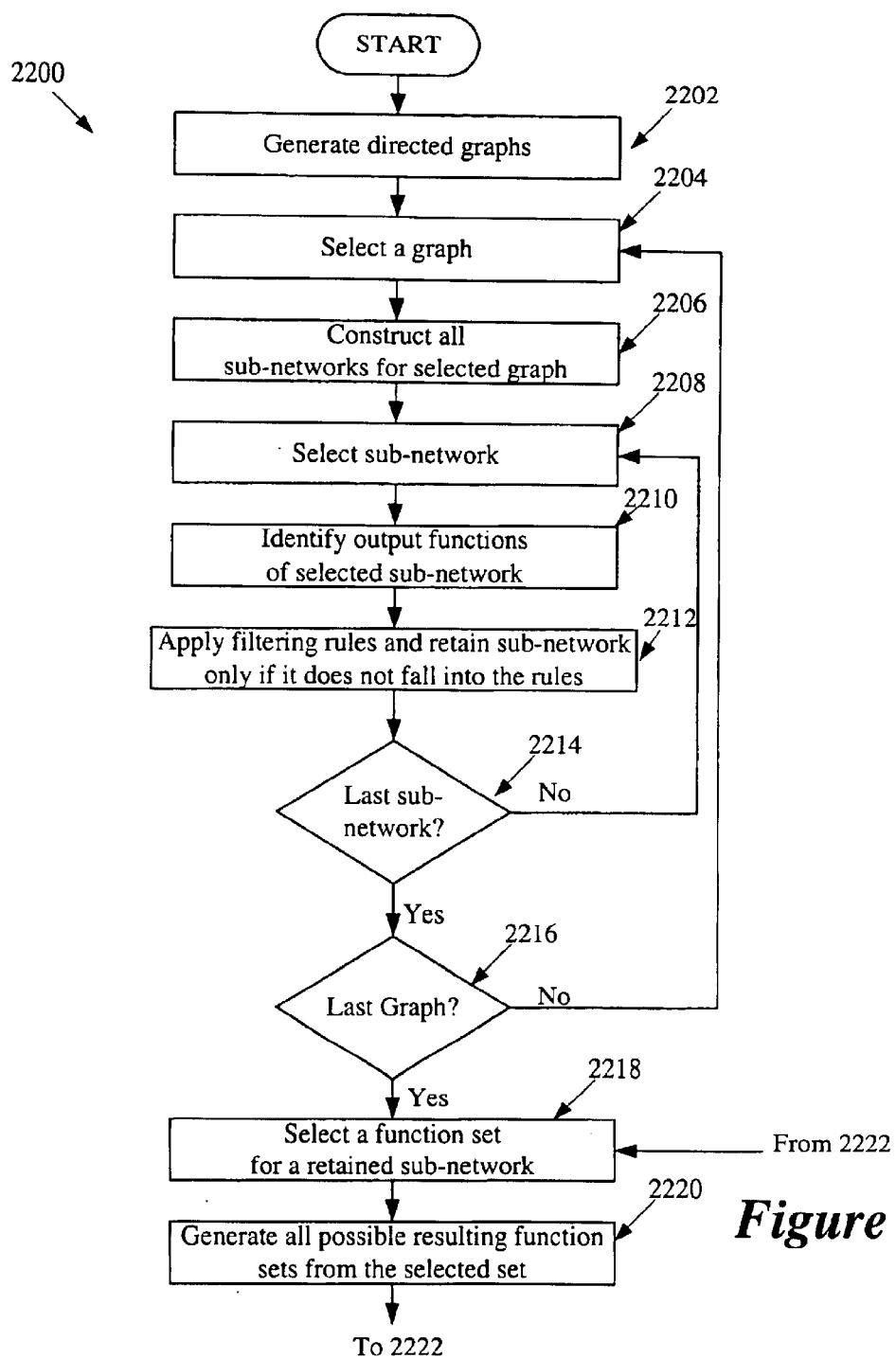
FIG. 22 illustrates a more specific process that a data generator performs in some embodiments of the invention.
Figure 22B:
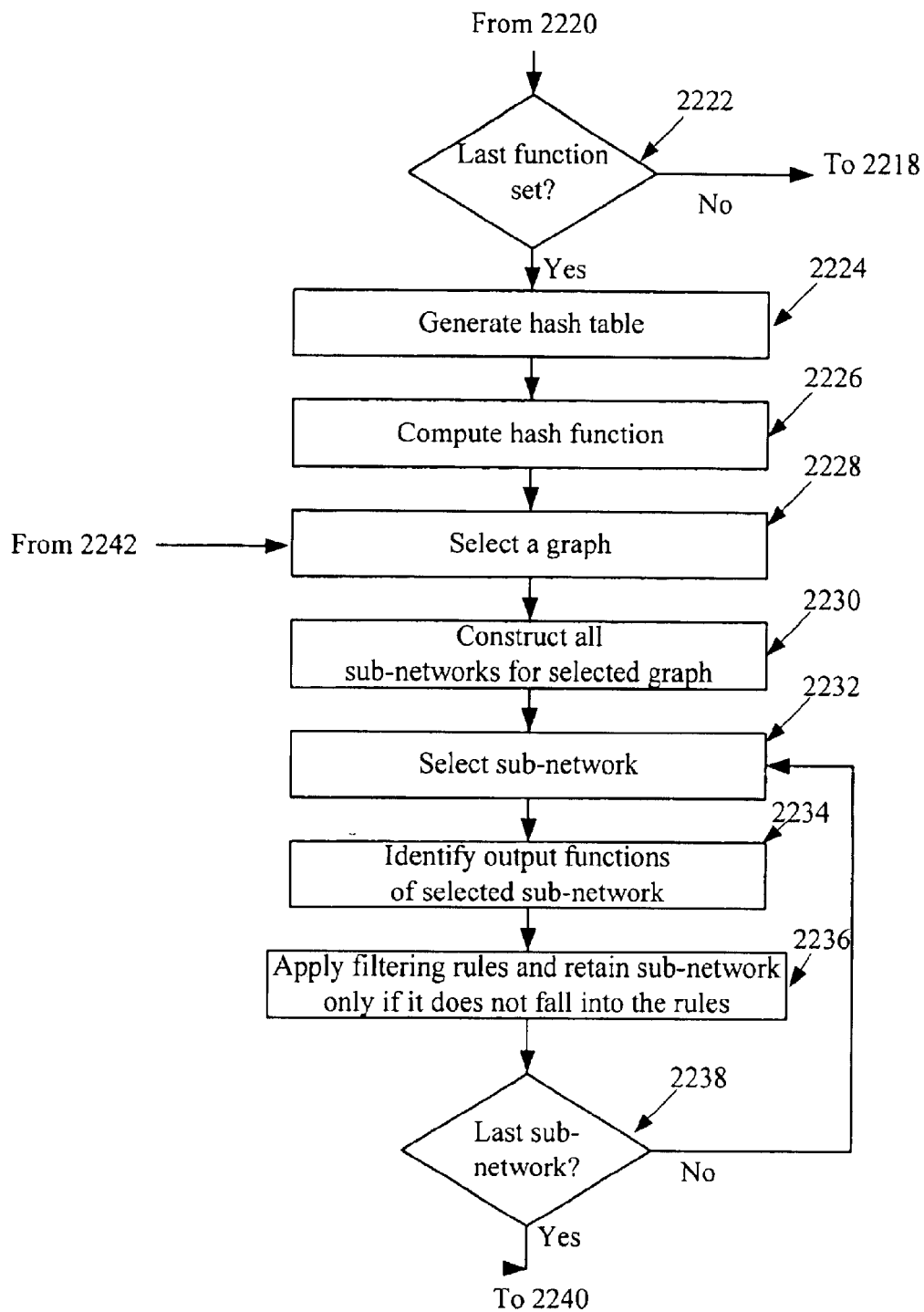
Figure 22C:
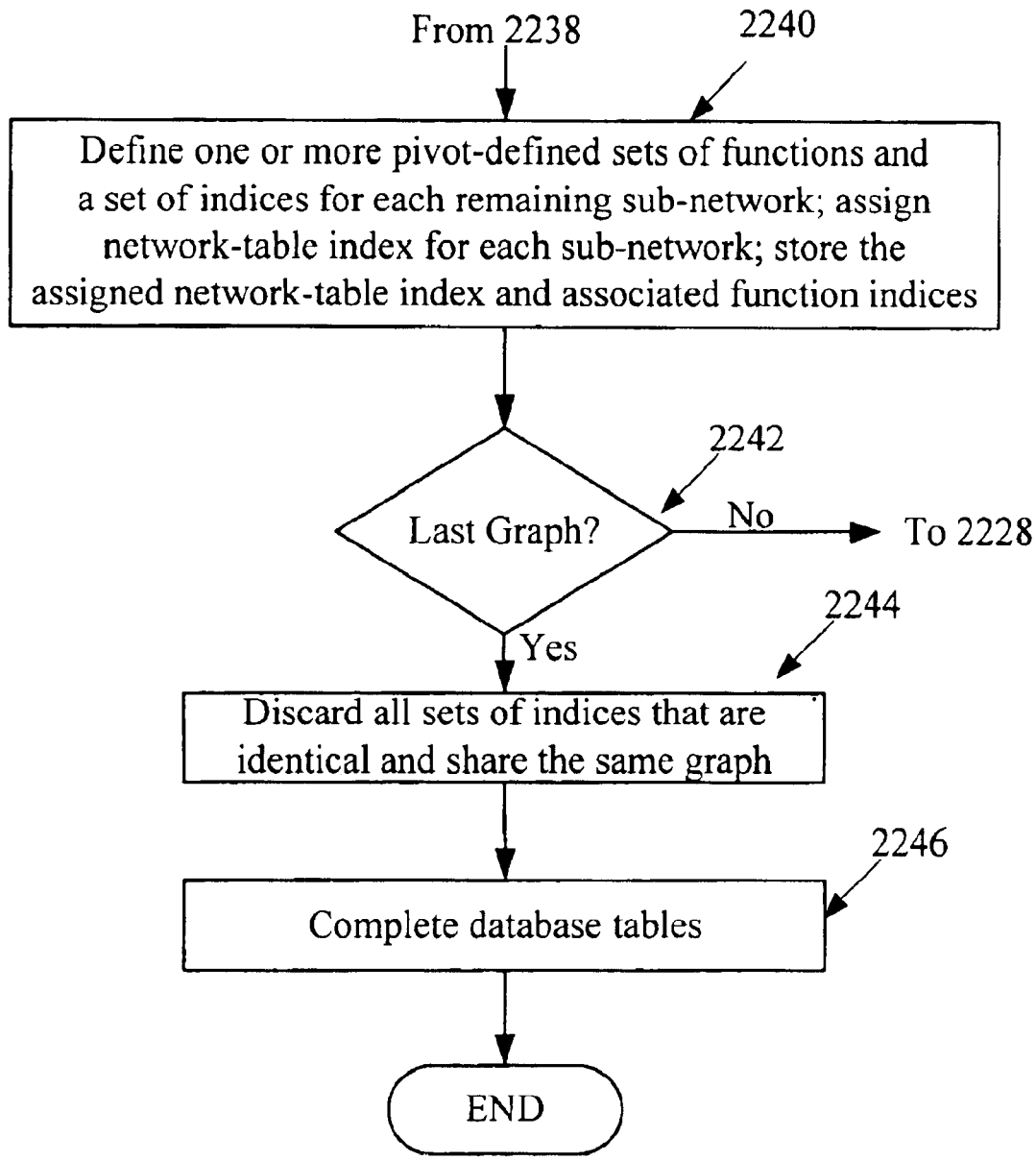

FIG. 22 illustrates a more specific process 2200 that the data generator 115 performs in some embodiments to construct and organize the data tables 525. Before it starts, this process receives (1) a set of combinational-logic functions (e.g., Boolean functions) that are allowed to serve as local functions (i.e., as functions of nodes in the combinational-logic sub-network), and (2) information specifying the maximum number of nodes and edges of the sub-networks that are to be constructed. The set of combinational-logic functions can be received in one or more function tables 1520, or can be organized in one or more function tables 1520 by the process 2200. Also, in the embodiments described below, each received function is expressed in terms of its ROBDD.

The received set of combinational-logic functions is called a combinational-logic library. In some embodiments, this library is typically derived from an existing technology library that contains all circuit elements that may be used for a specific technology. In this situation, the combinational-logic library contains all combinational-logic functions that can be computed by a single circuit element within this technology library. Moreover, it contains additional information relating to the physical implementation of the corresponding circuit element (e.g., estimated size of the circuit element, estimated power consumption, timing characteristics, etc.). Such additional information can be used in the various network filters in order to construct databases that contain only networks with specific characteristics.

In other embodiments, the combinational-logic library includes functions that are not all from one specific technology library. For instance, for a database that is not bound to a specific technology library, the combinational-logic library can include local functions from one or more technology libraries and/or additional abstract functions that are not from any particular technology library. The artificially defined functions correspond to artificially defined circuit elements that have artificially defined physical characteristics. By using a combinational-logic library that includes arbitrary local function, it is possible to construct a database free from any set of specific technology characteristics. Some embodiments require, however, that the set of functions be complete so that the generator can generate most, if not all, combinational-logic functions. Other embodiments, on the other hand, do not impose this requirement.

As shown in FIG. 22, the process 2200 initially generates (at 2202) numerous directed graphs up to the given maximum number of nodes and edges. The process 2200 in some embodiment generates graphs with at most 8 nodes and at most 16 edges, because the number of graphs grows exponentially with the number of nodes and edges. The pseudo code below illustrates how some embodiments generate such directed graphs.

---

For node_number = 1,..,max_node_number
    For edge_number = 1,..,max_edge_number
        Construct all graphs that have node_number nodes and
        edge_number edges and that have a top node that is dependent
        on all input variables,
        For each constructed graph, if graph is not isomorphic to any
        previously saved graphs and if graph is cycle free, then encode
        graph and save encoded graph in a list
Construct the Graph Table 1515 from the list of saved graphs.

---

Figure 23:
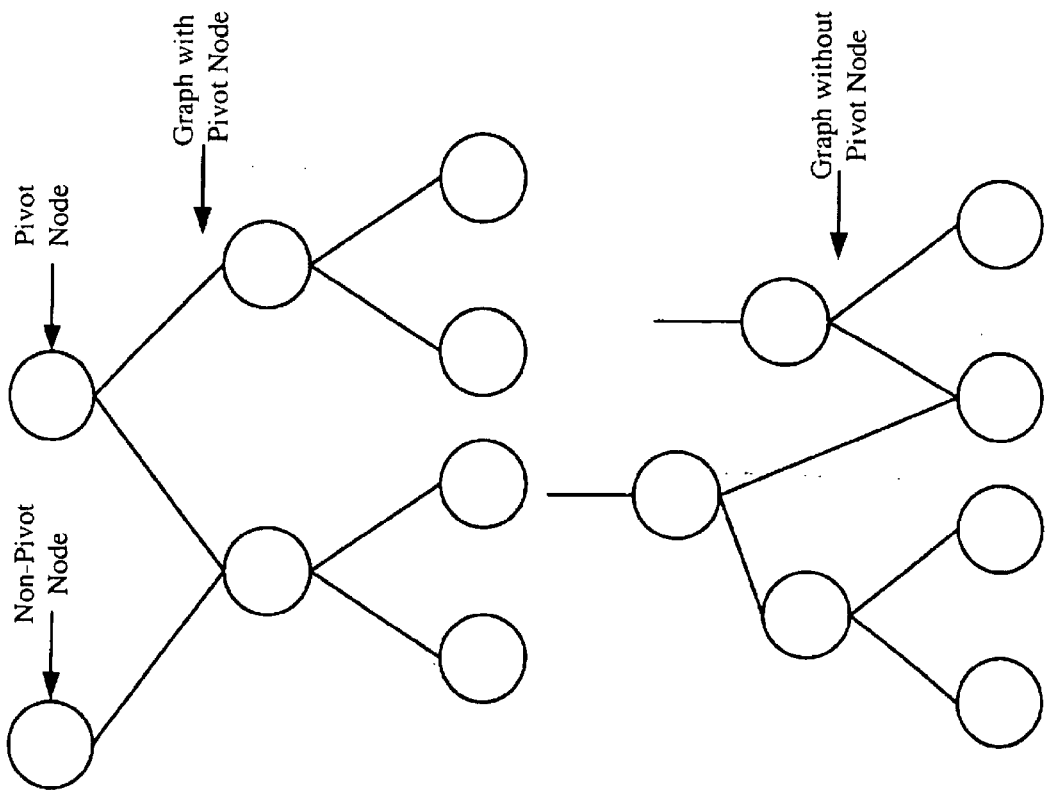
FIG. 23 illustrates a pivot node of a graph.

As indicated in the pseudo code above, the process 2200 in some embodiments performs 2202 by initially enumerating all combinations of nodes and edges. For each combination of nodes and edges, the process then constructs each graph that has the number of nodes and edges in the combination and that has at least one pivot node. As illustrated in FIG. 23, a pivot node is a node that has its topological fan-in cone receive all the input variables.

Numerous known techniques can be used to construct all graphs for a given number of nodes and edges. Some embodiments construct initially all undirected graphs for a given number of nodes and edges. There are software packages available for constructing all undirected graphs. One such package is the "geng" program package by Brendan D. Mckay (who may be contacted by email), Computer Science Department, Australian National University. This package can be downloaded through the internet.

After generating all undirected graphs, these embodiments generate all directed graphs by trying all possible assignments for directions on all edges of each graph. After constructing all directed graphs for each combination of nodes and edges, the process discards all cyclic graphs for the combination, and then stores each remaining graph in the graph table so long as the graph is not isomorphic to a previously stored graph.

Checking for cycles and identifying isomorphic graphs is commonly known in the art. For instance, Cormen, Leiserson, Rivest and Stein, Introduction to Algorithms, Second Edition. Chapter 22 (Elementary Graph Algorithms), MIT Press 2001 discloses one manner of checking a graph for cycles by traversing the graph. In addition, there are software packages available for identifying isomorphic graphs. One such package is the "nauty" package by Brendan D. Mckay (who may be contacted by email), Computer Science Department, Australian National University. This package can be downloaded through the internet.

For each graph that the process 2200 stores in the graph table, the process assigns and stores a graph-table index. The graphs are stored in the graph table index in a particular order specified by their graph-table indices (e.g., are sorted by increasing indices).

After 2202, the process 2200 selects (at 2204) one of the graphs from the graph table. It then constructs (at 2206) all combinational-logic sub-networks that can be derived from the selected graph. The process constructs each sub-network for the selected graph by assigning a unique set of functions to the set of nodes for the graph. Any function of the combinational-logic library can be assigned to any node of the graph so long as the node is suitable for the function. A node is suitable if the number of ingoing edges of this node is equal to the number of variables on which the function depends. In some embodiments, each sub-network specified at 2206 is expressed temporarily in terms of its graph and the set of local functions for the nodes of this graph.

The process next selects (at 2208) a sub-network identified at 2206. The process then computes (at 2210) all output functions that the selected sub-network realizes (i.e., identifies a function for each output of the sub-network). In some embodiments, the process defines the output of each node of the sub-network as an output of the sub-network. Also, the output function at a particular node's output is the particular node's local function when the particular node does not receive the output of any other node in the graph. Alternatively, when the particular node receives the output of another node or other nodes in the graph, an output function at the particular node's output can be derived from the particular node's local function and the local function of each node whose output the particular node receives.

In some embodiments, each sub-network specified at 2210 is expressed just in terms of its set of output functions. This is because at this stage the sub-networks are constructed only to create the hashing function. Also, at this stage, each output function is expressed in terms of its ROBDD. Also, at 2210, the process identifies any output function of a sub-network that can serve as a pivot function. As mentioned above, a sub-network's pivot function is a function that is dependent on all the inputs to the sub-network.

The process then (at 2212) applies a set of filtering rules to the selected sub-network and discards (i.e., filters) the selected sub-network if the selected sub-network falls into any one of these rules. In different embodiments, the process uses different sets of rules to filter the sub-networks. For instance, in some embodiments, the process 2200 discards a sub-network when (1) the sub-network has duplicate output functions, (2) it has an output function that is identical to one of the sub-network's inputs, or (3) it does not have a pivot output function. Even though each generated graph has a pivot node, the resulting sub-networks might not have pivot functions because some of the input variables might drop out as a result of the particular functions implemented by the sub-networks.

Figure 24:
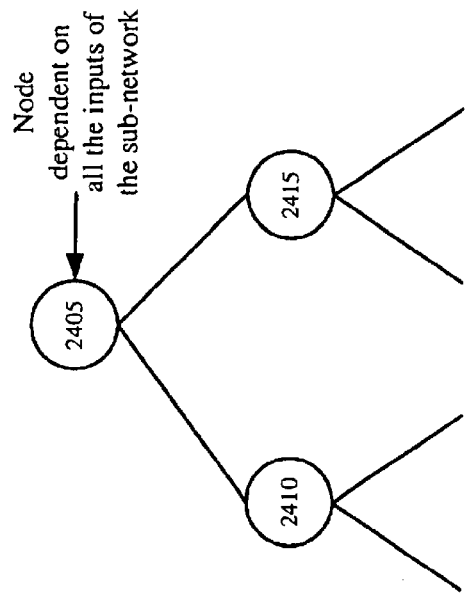
FIG. 24 illustrates a three-node sub-network.

The process also discards a sub-network when the sub-network has at least one node with an output that is not dependent on all the inputs that are fed into the node's topological fan-in cone. For instance, FIG. 24 illustrates a three-node sub-network that includes a first node 2405 that receives the outputs of second and third nodes 2410 and 2415, where the second node receives first and second input signals, and the third node receives third and fourth input signals. In such a sub-network, the output of each node must depend on its inputs, and the output of the first node must depend on the first through fourth inputs, according to the above-described filtering rule.

The process next determines (at 2214) whether it has examined all the sub-networks generated at 2206. If not, it transitions back to 2208 to select an unexamined sub-network. Otherwise, it determines (at 2216) whether it has examined all the graphs generated at 2202. If it has not examined all the graphs, it transitions to 2204 to select an unexamined graph.

If the process has examined all the graphs, it transitions from 2216 to 2218. By the time the process reaches 2218, it has identified and retained numerous sub-networks. Each retained sub-network is specified by a set of output functions that includes one or more functions that can serve as pivot functions. Each sub-network's function set might also include one or more functions that cannot serve as pivot functions.

Next, the process uses (at 2218–2226) the generated sets of output functions of the sub-networks to generate a hashing function. Specifically, at 2218, the process selects one set of output functions (which represents one sub-network) that was not discarded at 2212 (i.e., that remains after 2216).

From this selected set, the process defines (at 2220) one or more sets of functions, with each defined set having one pivot function and potentially one or more non-pivot functions (a set does not have a non-pivot function if it only has one function). At 2220, the process defines as many sets of functions as there are potential pivot functions in the set selected at 2218. For instance, the set selected at 2218 might have five functions (F1, F2, F3, F4, and F5), of which only the second and third (F2 and F3) ones can serve as pivot functions. From such a set, the process defines (at 2220) two sets of functions, one with the second function as the pivot function and the rest as non-pivot functions, and the other with the third function as the pivot function and the rest as non-pivot functions.

For each of the function sets identified at 2220, the process 2200 directs the indexer to generate a truthtable representation of each function in the set based on an input variable ordering that is identified from the pivot function. As described above, some embodiments select the input ordering that leads to the canonical truthtable representation of the pivot function. In some embodiments, the canonical truthtable is the smallest-valued truthtable.

When several input variable orderings lead to the pivot function's canonical truthtable representation during database generation, the indexer's process 800 deterministically selects the input ordering. Specifically, as mentioned above, the indexer's input order identifier always returns (at 810) the set of input variable configurations in a particular order. When the indexer operates deterministically during pre-tabulation, the index manager always selects (at 815) the same input configuration in the returned set of input configurations as the designated input configuration. For instance, in some embodiments, the index manager always selects the first input configuration in the returned set as the designated configuration.

The process then determines (at 2222) whether it has examined all sub-networks that were retained at 2212 (i.e., whether it has examined all sets of functions that remained after 2216). If not, the process returns to 2218 to select another set of output functions (which represents another sub-network) that was not discarded at 2212.

Otherwise, the process generates (at 2224) a hash table by associating the truthtable of each particular function in each set defined at 2220 with a particular index value. The process then computes a hashing function (at 2226) based on the generated hash table. One such manner of generating a hash table and function is described in Czech's paper, which was cited above.

After 2226, the process essentially executes all of the operations 2204–2216 once again. Specifically, at 2228, the process selects one of the graphs from the graph table generated at 2202. It then constructs (at 2230) all combinational-logic sub-networks that can be derived from the selected graph. The process constructs each sub-network in the same manner as described above for 2206.

The process next selects (at 2232) a sub-network identified at 2230. The process then (at 2234) computes all output functions that the selected sub-network realizes (i.e., identifies a function for each output of the sub-network) and identifies each of the sub-network's output functions that can serve as a pivot function. The operation of the process at 2234 is similar to its operation at 2210, except that at 2234 the process specifies each sub-network not only in terms of its identified output functions but also in terms of its graph. At this stage, each output function is expressed in terms of its ROBDD.

The process then applies a set of filtering rules to the selected sub-network and discards (i.e., filters) the selected sub-network if the selected sub-network satisfies any one of these rules. The process applies the same filtering rules at 2236 that it applied at 2212.

The process next determines (at 2238) whether it has examined all the sub-networks generated at 2230. If not, it transitions back to 2232 to select an unexamined sub-network. Otherwise, for each sub-network that the process retained at 2236, it defines (at 2240) one or more sets of output functions, with each set having one pivot function and potentially one or more non-pivot functions. As in 2220, the process at 2240 defines as many sets of functions for each particular sub-network as there are potential pivot functions in the function set specified at 2234 for the particular sub-network.

For each set of functions specified at 2240 for a particular sub-network, the process also generates (at 2240) a set of indices for the particular sub-network. Each set of indices includes one pivot index and potentially one or more secondary indices; a set does not include any secondary indices if it was generated for a function set with only one function.

At 2240, the process directs the indexer to generate a truthtable representation of each function in the set based on an input variable ordering that is deterministically selected from the canonical truthtable representation of the pivot function. The deterministic selection of the input variable ordering at 2240 is identical to the deterministic selection of the input ordering at 2220. Specifically, the indexer's input order identifier always returns (at 810) the set of input variable configurations in a particular order, and the index manager during pre-tabulation always selects (at 815) the same input configuration in the returned set of input configurations as the input configuration. After generating the truthtable representation of each function, the process generates (at 2240) the indices by using the hashing function generated at 2226.

At 2240, the process also assigns a network table index to each sub-network that was retained at 2236. For each retained sub-network, the process stores (at 2240) in a list the sub-network's graph table index (which specifies its graph in the graph table), one or more function table indices (each specifying a local function in the function table), one or more sets of function indices (which were defined at 2240), and a generated network table index.

After 2240, the process determines (at 2242) whether it has examined all the graphs generated at 2202. If it has not examined all the graphs, it transitions to 2228 to select an unexamined graph. Otherwise, it discards (at 2244) multiple definitions of the same network or nearly the same networks. This is done by deleting all but one out of each group of generated sub-networks that have (1) the same graph table index, and (2) the same sets of function indices (defined at 2240). Such duplicate networks may appear for example because of symmetries of the graph structure. Based on the list of network table indices and function indices, the process then completes (at 2246) the database tables 525. Specifically, the process first creates the network table 1510, then the secondary index table 1505, and then the pivot-index table 1500. As mentioned above, the network table is sorted in an order specified by its stored network indices, the secondary table is sorted in an order specified by its stored primary and secondary indices, and the primary table 1500 is sorted in an order specified by its stored primary indices. After 2246, the process ends.

The process 2200 generates a large number of combinational-logic sub-networks up to a specified size. This is radically different from previous approaches that work with network transformations from a small set of possibilities that are derived from expert knowledge. This new approach enables optimization processes to identify numerous sub-network alternatives through a simple and direct lookup into a database. In contrast, hand-coded transformations (whether directly implemented as program code or used as parametrizable input-rules to a logic synthesis system) can exploit only a small subset of possible implementations. Moreover, the above-described, automated database approach makes it possible to integrate expert knowledge in addition to the machine generated networks. In other words, this approach provides the ability to add sub-networks to the database with arbitrary circuit elements.

V. Technology Mapping

The data storage-driven synthesis described above can also be used to perform technology mapping. Some current logic synthesis systems perform the following three operations. First, they perform logic optimization on unbounded networks that contain circuit elements that perform arbitrary local functions. Second, they map the optimized network into a sub-optimal network that is made of simple local functions (like 2-way-NANDs, etc.). Third, they map the sub-optimal network into a bounded network that is bounded to a particular technology library. These systems follow this approach because the powerful logic-optimization techniques work best on unbounded circuit networks. Technology mapping operations do not always map the sub-network into a network that is made of simple local functions (like 2-way-NANDs, etc.). This operation simply makes the mapping to the technology library simpler.

There are other similar technology mapping systems. For instance, some systems perform the following three operations. First, they map an unbound network, which contains circuit elements that perform arbitrary local functions, into another network that is made of simple local functions (like 2-way-NANDs, etc.). Second, they perform logic optimization on the mapped network. Third, these systems map the optimized network into a network that is bound to a particular technology library.

Under current technology mapping techniques, additional mapping operations have to be performed to map into the target library in order to ensure the manufacturability of the final network. These mapping operations need to take into account physical implementation details (such as timing and size of the gates). These mapping operations are usually based on different algorithms from those used for the optimization operation. Therefore, there is the risk of getting sub-optimal results from the algorithmic differences between the optimization and technology mapping operations.

One type of technology mapping operation is tree mapping. Typical tree mapping operations use recursive dynamic programming techniques that (1) select small sub-networks, (2) in each selected sub-network, identify micro-trees or micro-leaf DAG's with one or more elements, and then (3) map each micro-tree or micro-leaf DAG to one gate in the technology library. Other tree mapping operations identify micro-trees directly from the network, and then map each micro-tree to one gate in the technology library.

A tree includes N nodes and N–1 edges. A micro-tree is a tree with a few nodes. A DAG is a directed acyclic graph. A DAG can have any number of edges. A micro-leaf DAG is similar to a micro-tree except that its leaf nodes can have outputs that connect to more than one other node.

The tree-mapping operations select micro-tree or micro-leaf DAG sub-networks that have only one output, which is the output at the root node (top-level node) of the micro-tree or micro-leaf DAG. These operations do not select any graph structure that has lower-level nodes (i.e., its non-root nodes) that have outputs outside of the tree (i.e., have fan-outs to nodes outside of the tree). In other words, each graph selected by a typical tree-mapping operation has a set of fan-ins (i.e., one or more inputs) and only one fan-out (i.e., only one output).

Another previous technology mapping operation is structural mapping. Structural mappers typically use inverters and a single other type of gate (such as a two-input NAND or NOR) to remap the optimized network to a sub-optimal network. Under this approach, the local function of a node is entirely determined by the number of inputs of the node (e.g., a one-input-node is an inverter, while all other nodes are the chosen base function, such as a NAND). Therefore, the combinational-logic functions that are realized by any sub-network are entirely defined solely by its graph structure.

Structural mappers also typically remap each element in the technology library into a graph structure by using inverters and the same type of gate used to remap the optimized network. Once each member of the technology library is represented as some graph, the structural mapping process then partitions the sub-optimal network into sub-parts. For each sub-part, it then tries to identify a graph structure (1) that represents a single element in the target library that corresponds to the sub-part's graph structure, and (2) that is as good as possible according to specific cost functions (area, timing, power). The partitioning process is often performed using string matching techniques similar to the ones that are used within compilers that translate high-level programming languages to low-level machine languages.

Though structural mapping defines a general framework to solve the library mapping task, it has several practical disadvantages. Efficient algorithms are known only for tree structures. More general graph structures have to be decomposed heuristically into simple tree structures. This decomposition makes the quality of structural mapping suffer from this artificial decomposition.

The invention's data storage-driven optimization does not suffer from any of these deficiencies. The candidate sub-networks that it maps to a particular technology do not need to have tree structures, but rather can have more general directed acyclic graph ("DAG") structures. There is no restriction on the number of edges that these structures can have. Also, each candidate sub-network can have multiple output nodes. Accordingly, the candidate sub-networks can be larger, as their internal nodes can have fan-outs to nodes outside of the sub-networks. In addition, the data storage-driven optimization can explore large number of pre-tabulated sub-networks based on their functions. It does not require inefficient mapping to simple gates. Also, it can retrieve a multi-element replacement sub-network in a single operation based on this sub-networks set of output functions. Moreover, for a particular set of local functions, it can pre-tabulate all sub-networks up to a specified level of complexity.

Figure 25:
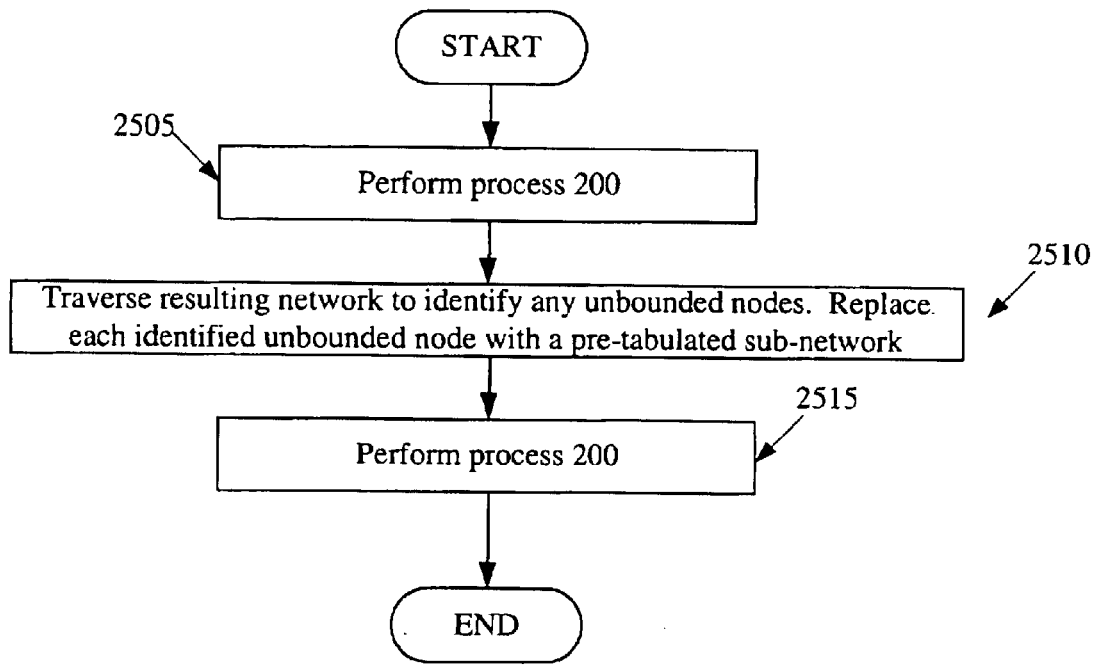
FIG. 25 illustrates a process for performing technology mapping according to some embodiments of the invention.

FIG. 25 illustrates a process 2500 for performing technology mapping using the invention's data storage-driven optimization. This process starts each time it receives (1) a circuit network that is not designed for a specific technology library, and (2) a database (or other storage structure) that contains pre-tabulated sub-networks that are bound to the specific technology library. The database can be pre-tabulated based on the approach described above in Section IV. Once the process 2500 receives the circuit network and the database, it optimizes the circuit network for the specific technology library.

As shown in FIG. 25, the process initially uses (at 2505) the received database to perform process 200 for the received circuit network. The process 200 continuously changes the received network so that more and more parts of it are bound to the target library (as each replacement sub-network is bound to the target library). Some embodiments might use the process 200 slightly differently when they use it as part of the process 2500 for technology mapping. So long as the query manager returns, for a selected candidate sub-network, at least one replacement sub-network from the data storage that stores the technology-bound sub-networks, these embodiments will always find (at 230) one of the replacement sub-networks acceptable, and thereby will always exchange (at 235) the selected candidate sub-network with one of the returned replacement sub-networks. Other embodiments, however, might still evaluate (at 230) whether to replace a selected candidate sub-network with one of the retrieved replacement sub-networks, and might not replace candidate sub-networks with replacement sub-networks in some instances. Also, when the query manager returns more than one replacement sub-network for a candidate sub-network, the process 200, as described above, selects one of the replacement sub-networks randomly or selects a replacement sub-network that has the best cost (which was computed at 225).

Once the process 200 reaches its stop criteria (e.g., performs a maximum number of iterations or reaches the stopping criteria of the optimization algorithm, such as the annealer), the process 2500 transitions to 2510. At 2510, the process 2500 traverses the circuit network that exists after 2505 in order to identify any node (i.e., any circuit element)

in this network that is potentially not bound to the target library. Some embodiments regard a node as potentially unbound if it was not added to the circuit network within any exchange step performed in 2505. For any node N that is potentially not bound to a gate in the target library, the process 2500 treats the node N as a one-node candidate sub-network and accordingly finds all matching sub-networks in the database that realize the function of the node N. The process 2500 then replaces the node N with the best suitable replacement for this node. The process 2500 continues its search through the circuit network until it ensures that it contains any circuit element that is not bound to the technology library.

It should be noted that finding some replacement in the database for an unbound node is always possible as long as the local function of the node is not too complex. In the majority of cases, this criterion is easily satisfied. However, in cases where a network has an arbitrarily complex node function, the process 2500 needs to use other methods (e.g., Boolean decomposition by Shannon expansion as described above) first to simplify the unmanageable nodes and then to map the simplification to the target library. In other words, the process 2500 needs to decompose the complex node function into a set of smaller functions, and then identify a set of replacement sub-networks that perform the set of smaller functions.

After 2510, the process 2515 uses (at 2505) the received database to perform process 200 again on the circuit network that remains after 2510. The process 200 then optimizes this network again for the target library. This optimization can be viewed as a clean-up operation that rectifies any sub-optimal networks that resulted from the forced exchanges at 2510.

The technology mapping operation of process 2500 can be advantageous in many contexts. It provides superior mapping of networks that are not bound to any target library to a particular target library. Also, it provides superior mapping of networks from one bound target library to another. This can be highly advantageous when mapping from one technology (e.g., 0.13 micron technology) to another technology (e.g., 0.1 micron technology).

VI. NPN-Equivalence

As discussed above by reference to FIGS. 10–13, some embodiments treat as equivalent two sub-networks that can be made identical by permuting the set of inputs of one of the sub-networks. By using this first equivalence relationship, these embodiments can reduce the number of equivalent sub-networks that are stored in the data storage.

Some of these embodiments establish two other equivalence relationships to reduce the number of stored equivalent sub-networks. First, these embodiments treat as equivalent two sub-networks that can be made identical by inverting any subset of the inputs (i.e., one, several, or all of the inputs) of one of the sub-networks. Second, they treat as equivalent two sub-networks that can be made identical by inverting any subset of the outputs (i.e., one, several, or all of the outputs) of one of the sub-networks. Accordingly, in these embodiments, two sub-networks are treated as equivalent whenever they can be made identical by any combination of one or more of the following transformations: (1) inverting a particular subset of the inputs, (2) permuting the set of inputs, and (3) inverting a particular subset of the output. Two sub-networks are identical when they perform the same output functions and have the same graph.

The term NPN equivalence refers to all three equivalent relationships described above. In this term, the first "N" refers to the inversion of a subset of the inputs, the "P" refers to the permuting of the input set, and the second "N" refers to the inversion of a subset of the output set.

Both N equivalences are based on the assumption that the inversion of signals is cost-free (i.e., any signal in a design may be inverted by an additional inverter with no costs—area, timing, etc.).There are several reasons for this assumption. First, during early optimization, it may be suitable to drop the inversion issue and just focus on the general restructuring of the circuit description, since at this stage the final properties of the circuit description can only roughly be inferred. Second, some technologies by default provide output signals in both polarities (i.e., for each output pin "A," they have a pin "A_BAR" than provides the complemented signal). Third, by having no cost on inversions, the storage of pre-tabulated sub-networks can be made much more powerful, since more complex sub-networks can now be stored within the same amount of memory. This results in more powerful optimization as it enables exchange of more complex sub-networks.

The embodiments described above account for the P equivalence (i.e., account for the permuting of the input set). To account for the two N equivalences (i.e., to account for the equivalence due to the inversion of the input and/or output), the following operations have to be modified. Process 800 at 810 and 815.

To account for NPN equivalence, the canonicalization operation 810 of process 800 of FIG. 8 needs to be modified. For the truthtable representation of a combinational-logic function, the canonicalization can be made NPN-aware based on the technique disclosed in "Boolean Matching for Large Libraries" by Uwe Hinsberger and Reiner Kolla, DAC98, Jun. 15–19, 1998. This technique uses a similar branch and bound algorithm as the P-case. N-aware canonicalization for other combinational-logic function representations are disclosed in other references, such as "Efficient Boolean Function Matching", Jerry R. Burch and David E. Long, Proc. ICCAD 1992.

NPN-canonicalization of combinational-logic functions F_1 and F_2 results in the same representation whenever F_1 and F_2 can be made equal by a combination of (1) switching one or more input phases, (2) permuting inputs, and (3) switching one or more output phases. For the truthtable representation of a function F, the process of NPN-canonicalization for the function F identifies (at 810) one or more transformation sets. Each identified transformation set consists of some input switching, input permutation, output switching—in this order—and leads to the canonical truthtable representation of the pivot function. Specifically, each identified set of NPN transformations T specifies (1) an input variable configuration P, (2) a subset Z of the input variables to be switched, and (3) a Boolean variable O that indicates whether the whole function should be complemented or not.

At 810, the process 800 (at 810) identifies the NPN-canonical representation of the function F. This canonical representation is the truthtable that the function F produces after accounting for the transformations specified by one of the sets identified at 810 (i.e., after accounting for the set's input variable inversion Z, then accounting for the set's input variable configuration P, and then accounting for the set's output variable inversion O).

Instead of selecting only an input variable configuration at 815, the process 800 when running in an NPN-mode selects (at 815) an NPN transformation set. This transformation set is one of the ones identified at 810. The process 800 randomly selects this set to generate indices of a query during optimization. On the other hand, it deterministically selects this NPN transformation during pre-tabulation.

Process 900 at 910 and 915.

In NPN-mode, the process 900 of FIG. 9 receives (at 910) the NPN-transformation set selected at 815. The process 900 of FIG. 9 applies the N and the P transformations in the transformation set selected at 815 first to non-pivot functions of a multi-function query. Specifically, it applies the set's input variable inversion Z to a non-pivot function. It then applies the set's input variable configuration P after applying the set's input variable inversion Z. Next, it takes the resulting truthtable ("non-inverted truthtable") for the non-pivot function and inverts it to obtain an inverted truthtable. The process then examines the inverted and non-inverted truthtables as binary-number strings and selects the smaller one of the non-inverted truthtables and the inverted truthtable. The process then computes the hashed value based on the selected truthtable.

Process 1400 at 1415–35.

In NPN mode, the process 1400 determines an NPN transformation set T (Z,P,O) in a deterministic manner by selecting the first transformation specified in the list of returned transformations. At 1420, the process applies the inverse of the transformation X=(W, V, Y) that is used at 605 (i.e., it will use $X^{-1}(T)$). At 1425, the process computes the functions based on the reordering and input phase switching identified in 1420.

At 1430, the process checks whether the computed set includes the output function set of the candidate sub-network by additionally assuming two functions to be equal if one is the complement of the other. This is because the inversion of each individual output function of the replacement sub-network may be done in addition at no extra cost. If it does specify a match at 1435 all the necessary inverters (i.e., additional nodes with a single input that performs simply complementation of its input function) that realize the underlying input and output phase switches will be added to the replacement sub-network.

Process 2200 at 2220 and 2240

At 2220 or 2240, the process 22 deterministically identifies the NPN transformation (Z,P,O) based on the pivot function. At 2220 or 2240, the process 2200 then generates a truthtable for the pivot function according to the identified transformation. It also generates a truthtable for each non-pivot function of the set at 2220 or 2240. To generate the truthtable for a non-pivot function, it applies the set's input variable inversion Z to the non-pivot function. It then applies the set's input variable configuration P after applying the set's input variable inversion Z. Next, it takes the resulting truthtable ("non-inverted truthtable") for the non-pivot function and inverts it to obtain an inverted truthtable. The process then examines the inverted and non-inverted truthtables as binary-number strings, and selects the smaller one of the non-inverted truthtable and the inverted truthtable.

As mentioned further below, some embodiments do not use NPN-equivalence with technology mapping. Accordingly, the process 2500 of FIG. 25 is not modified.

Using the NPN-equivalence relationships establishes many more equivalences between the pre-computed sub-networks than just P-equivalence. Accordingly, the use of NPN-equivalence results in a large number of sub-networks and index sets being removed at 2242. This reduces the number of sub-networks in the data storage significantly and facilitates the creation of data storage with more complex sub-networks.

The size of the data storage can be reduced by not considering sub-networks that contain an explicit inverter. If the inverter drives inputs of other nodes of the sub-network, then it can be assumed that the node itself complements the input signal (at no cost). If the inverter drives a sub-network output O, then this is considered logically equivalent with a sub-network that generates the same functions except that the function at O is complemented. The embodiments that do not consider buffers (i.e., consider single-input/single-output nodes that just present the input signal at the output) for either P-only equivalence or NPN-equivalence, do not consider graphs with any node that has only one input during pre-tabulation. This reduces the number of sub-networks in the data storage significantly and facilitates the creation of data storage with more complex sub-networks.

Accounting for NPN-equivalence is usually an optimization that is done for unbound combinational-logic networks. Optimizing bound combinational-logic networks or mapping unbound combinational-logic networks to bound ones is usually accomplished by being fully aware of physical characteristics of the gates of the target library (in costing). Inversion is usually not cost free with respect to such detailed physical characteristics. Accordingly, neither N-equivalence is used during technology mapping. Only P-equivalence is considered during technology mapping.

One of ordinary skill will realize that other embodiments might just account for NP-equivalence or PN-equivalence (i.e., might consider just input or just output inversion to be cost free). In these circumstances, the canonicalization is just NP or PN canonicalization. The PN-case may be interesting even for bound combinational-logic networks as some technology libraries indeed always provide output pins for both polarities of the signal.

VII. The Computer System

Figure 26:
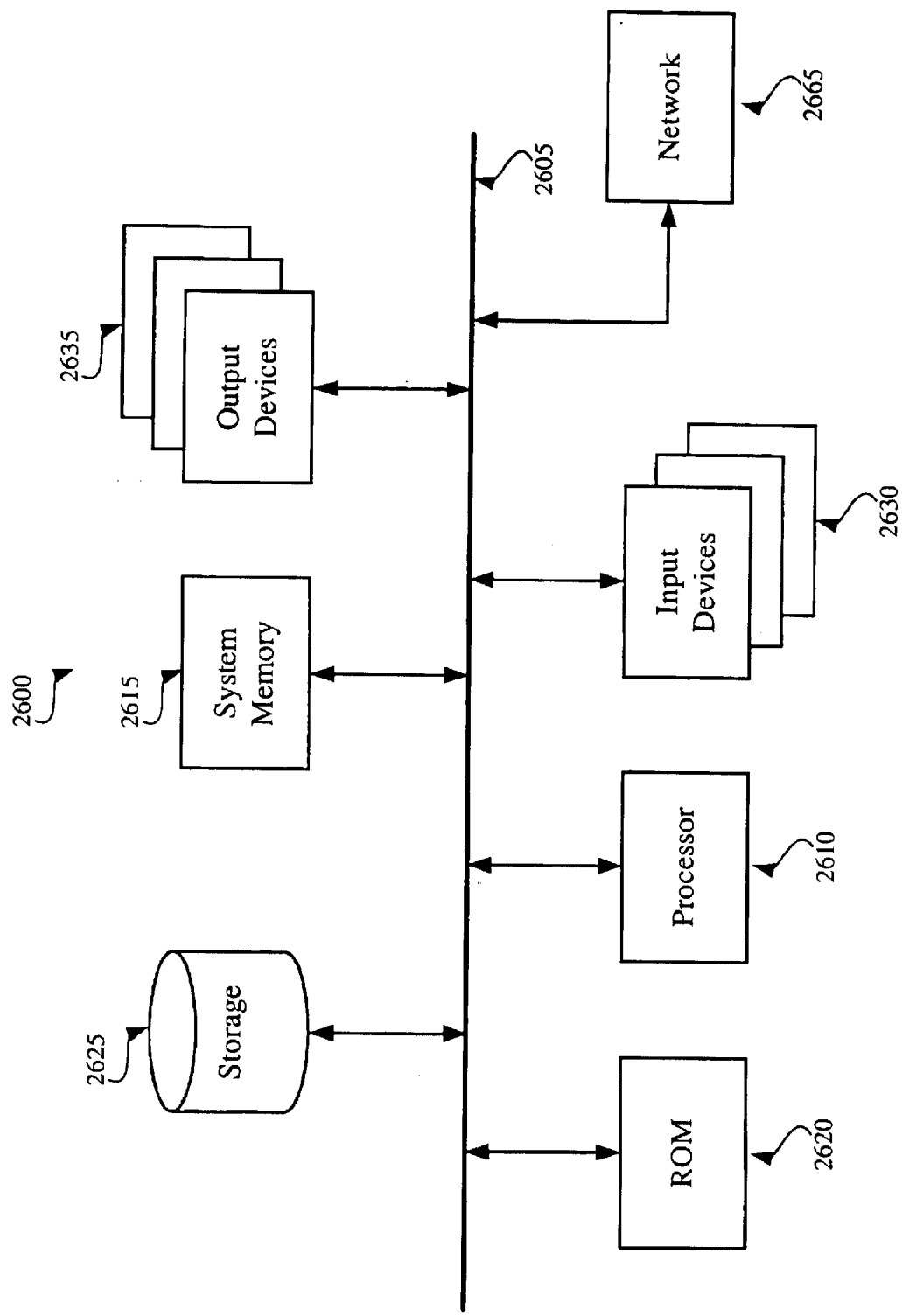
FIG. 26 illustrates a computer system that can be used in conjunction with some embodiments of the invention.

FIG. 26 presents a computer system with which one embodiment of the present invention is implemented. Computer system 2600 includes a bus 2605, a processor 2610, a system memory 2615, a read-only memory 2620, a permanent storage device 2625, input devices 2630, and output devices 2635.

The bus 2605 collectively represents all system, peripheral, and chipset buses that communicatively connect the numerous internal devices of the computer system 2600. For instance, the bus 2605 communicatively connects the processor 2610 with the read-only memory 2620, the system memory 2615, and the permanent storage device 2625.

From these various memory units, the processor 2610 retrieves instructions to execute and data to process in order to execute the processes of the invention. The read-only-memory (ROM) 2620 stores static data and instructions that are needed by the processor 2610 and other modules of the computer system. The permanent storage device 2625, on the other hand, is read-and-write memory device. This device is a non-volatile memory unit that stores instruction and data even when the computer system 2600 is off. Some embodiments of the invention use a mass-storage device (such as a magnetic or optical disk and its corresponding disk drive) as the permanent storage device 2625. Other embodiments use a removable storage device (such as a floppy disk or zip® disk, and its corresponding disk drive) as the permanent storage device.

Like the permanent storage device 2625, the system memory 2615 is a read-and-write memory device. However, unlike storage device 2625, the system memory is a volatile read-and-write memory, such as a random access memory. The system memory stores some of the instructions and data that the processor needs at runtime. In some embodiments, the invention's processes are stored in the system memory 2615, the permanent storage device 2625, and/or the read-only memory 2620.

The bus 2605 also connects to the input and output devices 2630 and 2635. The input devices enable the user to communicate information and select commands to the computer system. The input devices 2630 include alphanumeric keyboards and cursor-controllers.

The output devices 2635 display images generated by the computer system. For instance, these devices display IC design layouts. The output devices include printers and display devices, such as cathode ray tubes (CRT) or liquid crystal displays (LCD).

Finally, as shown in FIG. 26, bus 2605 also couples computer 2600 to a network 2665 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 2600 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, some embodiments might store sub-networks differently than the storage-scheme described above. Also, some embodiments might use databases and data storages that are not machine generated. In addition, some embodiments might use different encoding and indexing schemes than those described above. Thus, one of ordinary skill in the art would understand that the invention is not to be limited by the foregoing illustrative details, but rather is to be defined by the appended claims.

We claim:

1. A method for performing technology mapping, the method comprising:
   a) receiving an IC design layout that is not bounded to a particular technology;
   b) repeatedly:
      selecting from the IC design layout a candidate sub-network;
      identifying at least one replacement sub-network from a storage structure that stores replacement sub-networks that are bound to the particular technology; and
      replacing the selected candidate sub-network in the IC design layout with the replacement sub-network;
   wherein at least a particular one of the selected candidate sub-networks has multiple circuit elements that provide at least three output Boolean functions of the particular candidate sub-network.

2. The method of claim 1, wherein identifying the replacement sub-network comprises:
   generating a parameter based on a set of output functions performed by the selected candidate sub-network, wherein the parameter identifies the replacement sub-network.

3. The method of claim 2 further comprising: using the parameter to retrieve the replacement sub-network from the storage structure.

4. The method of claim 1 further comprising:
   terminating the repetitions once a stopping criteria is reached.

5. The method of claim 4, wherein the IC design layout includes a plurality of circuit elements and the sub-networks are formed by circuit elements, the method further comprising:
   after terminating the repetitions, traversing the IC design layout to identify circuit elements that are not bound to the technology;
   for each identified circuit element, attempting to identify a replacement sub-network that is stored in the storage structure; and
   if at least one replacement sub-network for an identified circuit element is identified, replacing the circuit element in the IC design layout with the identified replacement sub-network.

6. The method of claim 5, wherein if more than one replacement sub-networks are identified for a circuit element, selecting one of the replacement sub-networks and replacing the circuit element with the selected replacement sub-network.

7. The method of claim 5, wherein each circuit element performs a function, wherein if no replacement sub-network is identified for an identified circuit element, decomposing the function of the circuit element into a set of functions, and then attempting to identify a set of replacement sub-networks in the storage structure that perform the set of functions.

8. The method of claim 1 further comprising:
   before replacing the candidate sub-networks with the replacement sub-networks, evaluating whether to replace the selected candidate sub-network with the replacement sub-network,
   wherein certain candidate sub-networks are replaced by replacement sub-networks based on the evaluation,
   wherein certain candidate sub-networks are not replaced based on the evaluations.

9. The method of claim 8, wherein the evaluating comprises computing a cost function.

10. A computer program embedded on a computer readable medium, the computer program for receiving an IC design layout that is not bounded to a particular technology and for mapping the IC design layout to the particular technology, the computer program comprising:
    a first set of instructions for selecting from the IC design layout a candidate sub-network;
    a second set of instructions for generating a parameter based on a set of output functions performed by the selected candidate sub-network;
    a third set of instructions for identifying, based on the parameter, at least one replacement sub-network from a storage structure that stores replacement sub-networks that are bound to the particular technology;
    a fourth set of instructions for replacing the selected candidate sub-network in the IC design layout with the replacement sub-network; and
    a fifth set of instructions for repeatedly executing the first to fourth sets of instructions,
    wherein at least a particular one of the selected candidate sub-networks has multiple circuit elements that provide at least three output Boolean functions of the particular candidate sub-network.

11. The computer program of claim 10, wherein the fifth set of instructions determines whether the computer program has reached a criterion for stopping the repetitions, wherein when the fifth set of instructions terminates the repetitions once the stopping criterion is reached.

12. The computer program of claim 11, wherein the IC design layout includes a plurality of circuit elements and the sub-networks are formed by circuit elements, the computer program further comprising:
- a sixth set of instructions for traversing the IC design layout, after terminating the repetitions, to identify circuit elements that are not bound to the technology,
- a seventh set of instructions for attempting to identify, for each identified circuit element, a replacement sub-network that is stored in the storage structure, and
- an eighth set of instructions for replacing a circuit element when at least one replacement sub-network is identified for the circuit element.

13. The computer program of claim 12, wherein each circuit element performs a function, the computer program further comprising:
- a ninth set of instructions for decomposing the function of a circuit element into a set of functions when no replacement sub-network is identified for a circuit element; and
- a tenth set of instructions for attempting to identify a set of replacement sub-networks in the storage structure that perform the set of functions.

* * * * *